(12) United States Patent
Miyashita et al.

(10) Patent No.: US 8,077,231 B2
(45) Date of Patent: *Dec. 13, 2011

(54) IMAGING APPARATUS CONTAINING A SOLID-STATE IMAGING DEVICE AND IMAGING METHOD

(75) Inventors: Takeshi Miyashita, Kurokawa-gun (JP);
Hirokazu Kobayashi, Saitama (JP);
Mitsuru Iwata, Odawara (JP);
Yoshiyasu Nishida, Karokawa-gun (JP)

(73) Assignee: Fujifilm Corporation, Tokyo (JP)

( * ) Notice: Subject to any disclaimer, the term of this patent is extended or adjusted under 35 U.S.C. 154(b) by 472 days.

This patent is subject to a terminal disclaimer.

(21) Appl. No.: 12/270,688

(22) Filed: Nov. 13, 2008

(65) Prior Publication Data
US 2009/0122170 A1 May 14, 2009

(30) Foreign Application Priority Data

Nov. 14, 2007 (JP) ................ P2007-295318

(51) Int. Cl.
*H04N 3/14* (2006.01)
*H04N 5/335* (2011.01)
*H04N 5/225* (2006.01)
*G02F 1/03* (2006.01)
*G02F 1/07* (2006.01)
*G01J 3/45* (2006.01)

(52) U.S. Cl. ......... 348/272; 348/340; 359/247; 356/451

(58) Field of Classification Search ............. 348/272, 348/273, 274, 275, 280, 340, 336, 337, 360, 348/361; 359/232, 247; 356/450, 451, 453

See application file for complete search history.

(56) References Cited

U.S. PATENT DOCUMENTS

| 5,031,032 A | * | 7/1991 | Perregaux et al. | 348/275 |
|---|---|---|---|---|
| 5,070,407 A | * | 12/1991 | Wheeler et al. | 348/342 |
| 6,184,929 B1 | * | 2/2001 | Noda et al. | 348/315 |
| 6,570,619 B1 | * | 5/2003 | Takayama | 348/342 |
| 6,642,964 B1 | * | 11/2003 | Perregaux et al. | 348/315 |
| 6,654,056 B1 | * | 11/2003 | Perregaux et al. | 348/275 |
| 7,186,039 B2 | * | 3/2007 | Mihara | 396/457 |
| 7,420,542 B2 | * | 9/2008 | Butterworth et al. | 345/166 |
| 7,443,440 B2 | * | 10/2008 | Nishiwaki et al. | 348/336 |
| 2007/0097252 A1 | * | 5/2007 | Silverstein | 348/336 |
| 2007/0145241 A1 | | 6/2007 | Tani | |
| 2009/0040520 A1 | * | 2/2009 | Misawa et al. | 356/326 |
| 2009/0109307 A1 | * | 4/2009 | Nishida et al. | 348/294 |

FOREIGN PATENT DOCUMENTS

JP 2007-180157 A 7/2007

* cited by examiner

*Primary Examiner* — John Villecco
(74) *Attorney, Agent, or Firm* — Birch, Stewart, Kolasch & Birch, LLP

(57) ABSTRACT

An imaging apparatus includes: a solid-state imaging device including a semiconductor substrate, a plurality of photoelectric conversion elements provided in the semiconductor substrate and a spectral element which is provided over the plurality of photoelectric conversion elements that are consecutive in a straight-line manner, in which a trapezoidal opening longitudinal in a direction from a bottom side into which light incident on the plurality of photoelectric conversion elements is introduced to a top side is provided, and which makes a spectral separation occur in the longitudinal direction by interference between the incident light and light reflected from an inner side surface of the trapezoidal opening; and a polarizing element which is provided on an optical path from a photographic subject to the solid-state imaging device and which allows polarized light to be transmitted therethrough.

35 Claims, 14 Drawing Sheets

IMAGING APPARATUS CONTAINING A SOLID-STATE IMAGING DEVICE AND IMAGING METHOD

CROSS-REFERENCE TO RELATED APPLICATIONS

This application claims the benefit of Japanese Patent Application JP 2007-295318, filed Nov. 14, 2007, the entire content of which is hereby incorporated by reference, the same as if set forth at length.

FIELD OF THE INVENTION

The present invention relates to an imaging apparatus which has high light use efficiency and is able to obtain detection signals corresponding to a plurality of colors with one opening.

BACKGROUND OF THE INVENTION

Single plate type solid-state imaging devices, such as a CMOS type solid-state imaging device and a CCD type solid-state imaging device, are known as solid-state imaging devices for imaging color images. Such a solid-state imaging device has a configuration in which a plurality of photodiodes, which are photoelectric conversion elements, are formed on a surface portion of a semiconductor substrate in the shape of a two-dimensional array, a light shielding layer is laminated thereon, and an opening allowing light to be incident on the photodiodes is provided in a place of the light shielding layer facing the photodiodes, as disclosed in JP-A-2007-180157, for example.

In many cases, color filters corresponding to three primary colors of red (R), green (G), and blue (B) are used. Moreover, for example, green (G) color filters are laminated on about half of the plurality of photodiodes formed to be arrayed in the shape of a two-dimensional array, red (R) color filters are laminated on half of the remaining photodiodes, and blue (B) color filters are laminated on the rest of the photodiodes. Thus, on a light receiving surface of each solid-state imaging device, color filters corresponding to the respective colors are arrayed as if the color filters had been distributed uniformly.

In the known solid-state imaging device described above, one light shielding layer opening corresponds to one photodiode and a color filter of one color corresponds to one light shielding layer opening. For this reason, about ⅔ of light incident on one photodiode is absorbed by a color filter (for example, blue light and green light incident on a red color filter are absorbed by the filter to become heat) which, in principle, causes a problem that the light use efficiency is low.

In addition, an optical image of a photographic subject imaged on a light receiving surface of a solid-state imaging device is sampled by each photodiode to be converted into an electric signal. In the known structure described above, however, a red sampling point, a green sampling point, and a blue sampling point are completely different. Accordingly, signal processing in which green and blue detection signals at the red sampling point are acquired by an interpolation operation of signals, which are acquired at surrounding green and blue sampling points, is required. Furthermore, there is also a problem that degradation of the quality of an imaged image caused by positional deviation of a sampling point cannot be prevented in principle.

SUMMARY OF THE INVENTION

The invention has been made in view of the above situation, and it is an object of the invention to provide an imaging apparatus which has high light use efficiency and is able to obtain detection signals corresponding to a plurality of colors with one opening.

According to an aspect of the invention, an imaging apparatus includes: a solid-state imaging device including a semiconductor substrate, a plurality of photoelectric conversion elements formed in the semiconductor substrate, and a spectral element which is placed over the plurality of photoelectric conversion elements that are consecutive in a straight-line manner, in which a trapezoidal opening longitudinal in a direction from a bottom side into which light incident on the plurality of photoelectric conversion elements is introduced to a top side is provided, and which makes a spectral separation occur in the longitudinal direction by interference between the incident light and light reflected from an inner side surface of the trapezoidal opening; and a polarizing element which is provided on an optical path from a photographic subject to the solid-state imaging device and which allows polarized light to be transmitted therethrough.

In the imaging apparatus according to the aspect of the invention, the polarizing element may also be used as cover glass that seals the solid-state imaging device.

The imaging apparatus according to the aspect of the invention may further include a driving mechanism which makes the polarizing element being retracted from and inserted into the optical path.

The imaging apparatus according to the aspect of the invention may further include a control unit that makes a control such that the polarizing element is retracted from the optical path at the time of preparatory photographing performed before present photographing in order to determine a photographing condition and the polarizing element is inserted on the optical path at the time of the present photographing.

The imaging apparatus according to the aspect of the invention may further include a control unit that makes a control such that the polarizing element is retracted from the optical path in a monochrome photographing mode and the polarizing element is inserted on the optical path in a color photographing mode.

The imaging apparatus according to the aspect of the invention may further include a control unit that makes a control such that the polarizing element is retracted from the optical path when an exposure value for present photographing is less than a threshold value and the polarizing element is inserted on the optical path when the exposure value is more than the threshold value.

In the imaging apparatus according to the aspect of the invention, the polarizing element may have a gradient of the amount of transmitted light in a direction being retracted and being inserted by the driving mechanism.

The imaging apparatus according to the aspect of the invention may further include an oscillation direction rotating unit that rotates an oscillation direction of the polarized light incident on the solid-state imaging device.

The imaging apparatus according to the aspect of the invention may further include a solid-state imaging device rotating unit that rotates the solid-state imaging device according to the oscillation direction rotated by the oscillation direction rotating unit.

In the imaging apparatus according to the aspect of the invention, the solid-state imaging device rotating unit may rotate the solid-state imaging device such that the longitudinal direction or a direction perpendicular to the longitudinal direction matches the rotated oscillation direction.

In the imaging apparatus according to the aspect of the invention, the spectral element in which the longitudinal direction is a first direction may be used as a first spectral element and the spectral element in which the longitudinal direction may be a second direction perpendicular to the first direction is used as a second spectral element, the solid-state imaging device may have a first pixel including at least one first spectral element and a second pixel including at least one second spectral element, and a photographing control unit that performs first photographing in a state where the oscillation direction of the polarized light is made to match the first direction of the first spectral element or a direction perpendicular to the first direction and performs second photographing in a state where the oscillation direction of the polarized light is made to match the second direction of the second spectral element or a direction perpendicular to the second direction and an image generating unit that generates image data using an imaging signal acquired from the first pixel by the first photographing and an imaging signal acquired from the second pixel by the second photographing may be further included.

In the imaging apparatus according to the aspect of the invention, the photographing control unit may perform preparatory photographing for determining photographing conditions of the first photographing and the second photographing before performing the first photographing and the second photographing, and the oscillation direction rotating unit may rotate the polarization direction such that the oscillation direction of the polarized light becomes a direction of 45° with respect to each of the first direction and the second direction at the time of the preparatory photographing.

In the imaging apparatus according to the aspect of the invention, the oscillation direction rotating unit may be a liquid crystal device provided between the polarizing element and the solid-state imaging device.

In the imaging apparatus according to the aspect of the invention, the spectral element in which the longitudinal direction is a first direction may be used as a first spectral element and the spectral element in which the longitudinal direction is a second direction perpendicular to the first direction may be used as a second spectral element, the solid-state imaging device may have a first pixel including at least one first spectral element and a second pixel including at least one second spectral element, the first and second pixels may be arrayed in a checkered pattern, and a driving mechanism capable of moving the solid-state imaging device may be included.

In the imaging apparatus according to the aspect of the invention, the polarizing element may be a reflecting member which reflects incident light and make the reflected light incident on the solid-state imaging device.

In the imaging apparatus according to the aspect of the invention, the reflecting member may be a half mirror, and a finder on which light transmitted through the half mirror is incident may be included.

In the imaging apparatus according to the aspect of the invention, the two solid-state imaging devices may be included, the polarizing element may be a polarization beam splitter, and one of the two solid-state imaging devices may be disposed on an optical path of first polarized light separated by the polarization beam splitter and the other one of the two solid-state imaging devices may be disposed on an optical path of second polarized light separated by the polarization beam splitter.

In the imaging apparatus according to the aspect of the invention, the longitudinal direction of the spectral element of the one solid-state imaging device may match the oscillation direction of the first polarized light, and the longitudinal direction of the spectral element of the other solid-state imaging device may match the oscillation direction of the second polarized light.

The imaging apparatus according to the aspect of the invention may further include an image data mixing unit that mixes first image data, which is obtained by photographing in the one solid-state imaging device, and second image data, which is obtained by photographing in the other solid-state imaging device, with a designated mixing ratio.

According to another aspect of the invention, an imaging method of imaging a photographic subject by a solid-state imaging device includes performing imaging by making polarized light of light from the photographic subject incident on a solid-state imaging device including a semiconductor substrate, a plurality of photoelectric conversion elements provided in the semiconductor substrate and a spectral element which is placed on the plurality of photoelectric conversion elements that are consecutive in a straight-line manner, in which a trapezoidal opening longitudinal in a direction from a bottom side into which light incident on the plurality of photoelectric conversion elements is introduced to a top side is provided, and which makes a spectral separation occur in the longitudinal direction by interference between the incident light and light reflected from an inner side surface of the trapezoidal opening.

In the imaging method according to the aspect of the invention, the imaging may be performed by making light from the photographic subject incident on the solid-state imaging device at the time of preparatory photographing performed before present photographing in order to determine a photographing condition and making the polarized light incident on the solid-state imaging device at the time of the present photographing.

In the imaging method according to the aspect of the invention, the imaging may be performed by making light from the photographic subject incident on the solid-state imaging device in a monochrome photographing mode and making the polarized light incident on the solid-state imaging device in a color photographing mode.

In the imaging method according to the aspect of the invention, the imaging may be performed by making light from the photographic subject incident on the solid-state imaging device when an exposure value present photographing is less than a threshold value and making the polarized light incident on the solid-state imaging device when the exposure value is more than the threshold value.

In the imaging method according to the aspect of the invention, the imaging may be performed by rotating the oscillation direction of the polarized light incident on the solid-state imaging device.

In the imaging method according to the aspect of the invention, the solid-state imaging device may be rotated according to the oscillation direction of the polarized light rotated.

In the imaging method according to the aspect of the invention, the solid-state imaging device may be rotated such that the longitudinal direction or a direction perpendicular to the longitudinal direction matches the rotated oscillation direction.

In the imaging method according to the aspect of the invention, the spectral element in which the longitudinal direction is a first direction may be used as a first spectral element and the spectral element in which the longitudinal direction is a second direction perpendicular to the first direction may be used as a second spectral element, the solid-state imaging device may have a first pixel including at least one first spectral element and a second pixel including at least one second spectral element, first photographing may be performed in a state where the oscillation direction of the polarized light is made to match the first direction of the first spectral element or a direction perpendicular to the first direction, second photographing may be performed in a state where the oscillation direction of the polarized light is made to match the second direction of the second spectral element or a direction perpendicular to the second direction, and image data may be generated and recorded using an imaging signal acquired from the first pixel by the first photographing and an imaging signal acquired from the second pixel by the second photographing.

In the imaging method according to the aspect of the invention, preparatory photographing for determining photographing conditions of the first photographing and the second photographing may be performed before performing the first photographing and the second photographing, and the polarization direction may be rotated such that the oscillation direction of the polarized light becomes a direction of 45° with respect to each of the first direction and the second direction at the time of the preparatory photographing.

In the imaging method according to the aspect of the invention, the polarized light may be incident on the solid-state imaging device through a liquid crystal device, and the oscillation direction may be rotated by controlling the alignment of the liquid crystal device.

In the imaging method according to the aspect of the invention, the spectral element in which the longitudinal direction is a first direction may be used as a first spectral element, and the spectral element in which the longitudinal direction is a second direction perpendicular to the first direction may be used as a second spectral element, the solid-state imaging device may have a first pixel including at least one first spectral element and a second pixel including at least one second spectral element, the first and second pixels may be arrayed in a checkered pattern, and photographing may be performed twice in a case where the solid-state imaging device is moved and a case where the solid-state imaging device is not moved.

In the imaging method according to the aspect of the invention, the polarized light incident on the solid-state imaging device may be generated by reflecting incident light with a reflecting member.

In the imaging method according to the aspect of the invention, the reflecting member may be a half mirror, and light transmitted through the half mirror may be incident on a finder.

In the imaging method according to the aspect of the invention, the two solid-state imaging devices may be used as a first solid-state imaging device and a second solid-state imaging device, and the imaging may be performed by separating incident light into first polarized light and second polarized light and making the first polarized light incident on the first solid-state imaging device and the second polarized light incident on the second solid-state imaging device.

In the imaging method according to the aspect of the invention, the longitudinal direction of the spectral element of the first solid-state imaging device may match the oscillation direction of the first polarized light, and the longitudinal direction of the spectral element of the second solid-state imaging device may match the oscillation direction of the second polarized light.

In the imaging method according to the aspect of the invention, the first image data obtained by photographing in the first solid-state imaging device and second image data obtained by photographing in the second solid-state imaging device may be mixed with a designated mixing ratio.

According to the aspects of the invention, it is possible to provide an imaging apparatus which has high light use efficiency and is able to obtain detection signals corresponding to a plurality of colors with one opening.

DESCRIPTION OF REFERENCE NUMERALS AND SIGNS

Figure 1:
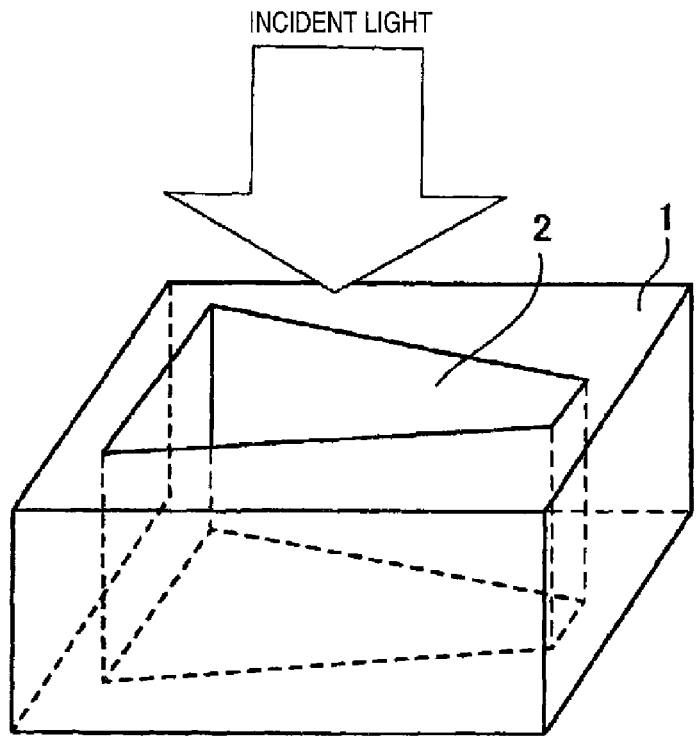
FIG. 1 is a perspective view illustrating a spectral element used in a solid-state imaging device according to a first embodiment of the invention.

1: spectral element
2: trapezoidal opening
2a: top side
2b: bottom side
11a: solid-state imaging device
11b: polarizing element

DETAILED DESCRIPTION OF THE INVENTION

Hereinafter, embodiments of the invention will be described with reference to the accompanying drawings.

First Embodiment

FIG. 1 is a perspective view illustrating a spectral element used in a solid-state imaging device according to a first embodiment of the invention. A spectral element 1 is formed of a metal thick plate in the present embodiment. In an example shown in the drawing, the spectral element 1 is provided such that a trapezoidal opening 2 passes from a top surface to a bottom surface as viewed from above.

An inner side surface of the opening 2 may be provided perpendicular to the top and bottom surfaces or may be provided to be inclined as a tapered opening such that an opening on the bottom surface becomes smaller than an opening on the top surface in different shapes.

The reason why the spectral element 1 is formed of a metal thick plate is because a sufficient length (length in the thickness direction) is needed for the inner side surface of the opening 2. The spectral separation is generated on the bottom surface side of the spectral element 1 by making white light incident on the opening 2 and reflected light of the white light which is reflected from the inner side surface of the opening 2 interfere with each other.

In order to reflect incident light on the inner side surface of the opening 2, the spectral element 1 is formed of a thick material. However, the spectral element 1 does not need to be formed of a metal thick plate, and it may be possible to form the opening 2 on a semiconductor substrate using integrated circuit manufacturing technology and to form an metal layer with a high reflectance on an inner side surface or top surface of the opening 2. A reflecting layer on the top surface functions as a light shielding layer.

Figure 2:
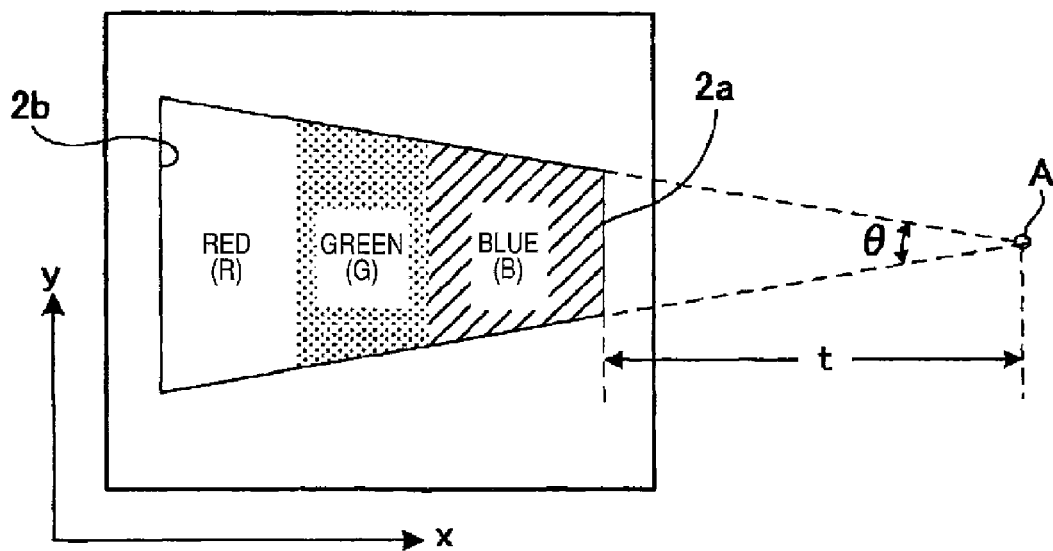
FIG. 2 is an explanatory view illustrating an opening of the spectral element shown in FIG. 1.

FIG. 2 is an explanatory view illustrating the opening 2. The opening 2 is formed in the trapezoidal shape as viewed from above. The opening 2 may have a trapezoidal shape in which four corners are angulated, or may have a shape in which four corners are round. Alternatively, the opening 2 may have an isosceles triangle whose top side is almost like an infinite 'point'. For this reason, an explanation will be made using a term of 'trapezoidal' opening.

Although an isosceles triangle is obtained by extending both side surfaces of the trapezoidal opening 2, spectral separation occurring within the opening 2 can be adjusted by opening the opening 2 by adjusting an apex angle θ of the isosceles triangle to a small angle equal to or smaller than a predetermined angle. In addition, a short-wavelength side of light separated can be specified by opening the opening 2 by adjusting a distance t from the apex A, which cuts a top side 2a of the trapezoidal opening 2, to the top side 2a.

As the size of the opening 2, for example, the height of the trapezoid is about 10 μm at most and the width (length of a bottom side 2b) is about 1 μm at most. However, in the case where the thickness of the spectral element 1 or the inner side surface of the opening 2 is not vertical but inclined, the size of the opening 2 also depends on the inclined angle, the apex angle θ, and the like. For this reason, the size of the opening 2 is not limited to those described above.

The degree of spectral separation corresponding to a color having a long wavelength becomes stronger toward a side of the bottom side 2b of trapezoid (opening 2), and the degree of spectral separation corresponding to a color having a short wavelength becomes stronger toward a side of the short side (top side) 2a. Therefore, it is preferable that spectral separation be performed in order of red (R), green (G), and blue (B) from the bottom side 2b to the top side 2a by selecting θ, t, thickness, inclined angle, length of the bottom side 2b, the type (reflectance) of a metal layer to be used, and the like, such that a signal processing technique developed for a known solid-state imaging device mounted with RGB color filters can be applied. However, even in the case of spectral separation not corresponding to the three primary colors of RGB, a color image of a photographic subject can be reproduced by detecting the amount of light for every spectral separation.

Hereinafter, a case where the spectral element 1 of the present embodiment separates incident light into three primary colors of RGB will be described.

Figure 3:
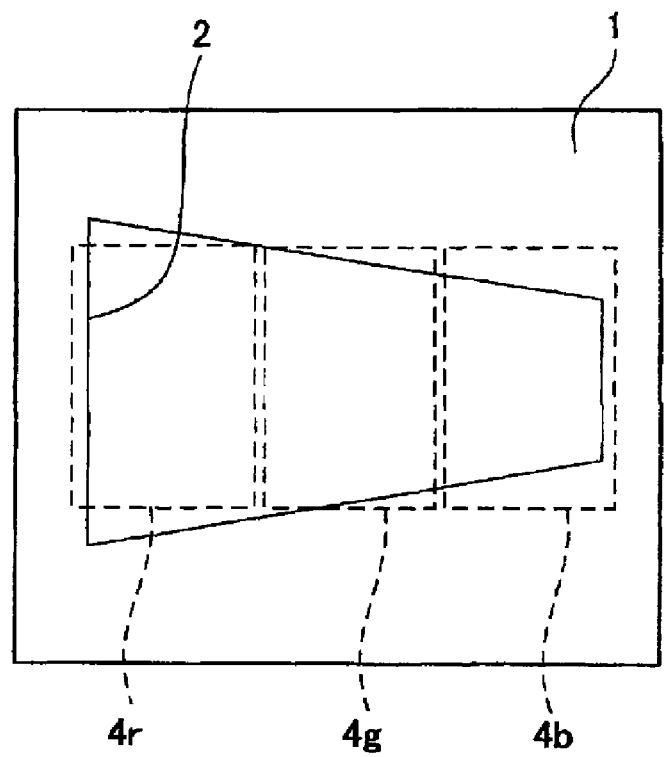
FIG. 3 is an explanatory view illustrating photodiodes provided below one opening of the spectral element shown in FIG. 1.

FIG. 3 is an explanatory view illustrating a photodiode provided below one opening 2. In the example shown in the drawing, three photodiodes 4r, 4g, and 4b are provided in order from a bottom side 2b to a top side 2a of the trapezoidal opening 2. That is, one unit pixel is formed by providing the spectral element 1 on the three photodiodes 4r, 4g, and 4b, which are located consecutively in a line, among a plurality of photodiodes formed in the shape of a two-dimensional array in the semiconductor substrate.

Since most of the light components incident on the opening 2 of the unit pixel are incident on the three corresponding photodiodes 4r, 4g, and 4b by separation and thus contribute to photoelectric conversion, the light use efficiency is high and a high-sensitivity subject image can be imaged.

In addition, for example, in the case where the spectral element 1 is designed such that light is separated into six light components, one unit pixel is formed by assigning one photodiode for every light component separated and providing the spectral element 1 on the six photodiodes arrayed in a straight-line manner.

Figure 4:
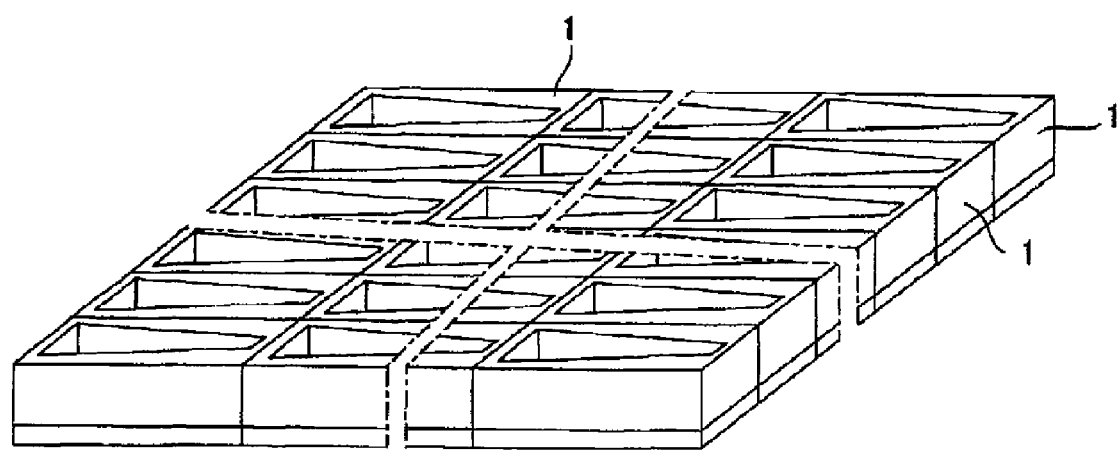
FIG. 4 is a perspective view illustrating a state where unit pixels shown in FIG. 3 are arrayed in the shape of a two-dimensional array.

FIG. 4 is a perspective view illustrating a state where the unit pixels shown in FIG. 3 are arrayed in the shape of a two-dimensional array. In the example shown in the drawing, a line which separates the spectral elements 1 is not shown. In practice, however, the plurality of trapezoidal openings 2 are formed on a metal plate (or a semiconductor substrate) with a one-sheet configuration in the shape of a two-dimensional array and the metal plate (or the semiconductor substrate) is disposed such that three photodiodes overlap below each opening 2.

Figure 5:
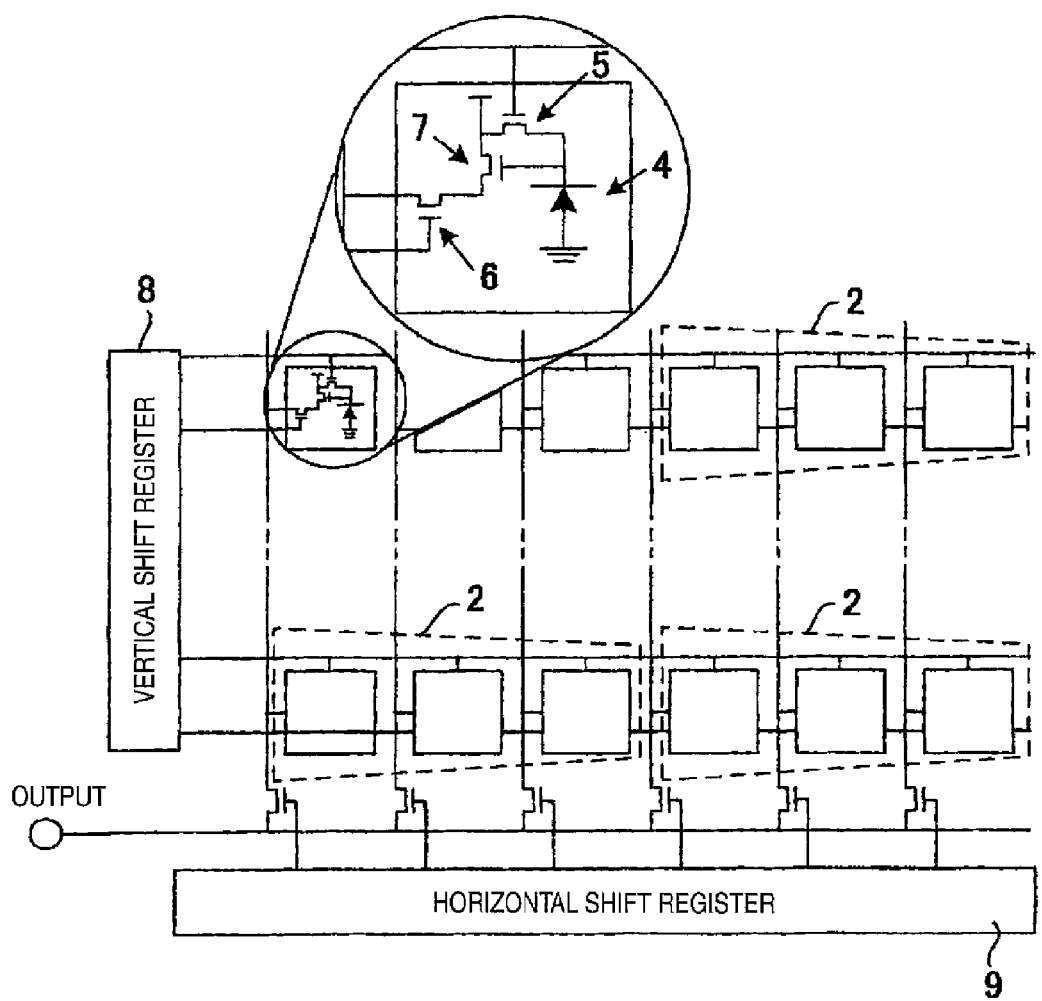
FIG. 5 is a view illustrating a signal read circuit and wiring connection of each photodiode included in a unit pixel.

FIG. 5 is a view illustrating a signal read circuit and wiring connection of each photodiode. FIG. 5 is the same as a signal read circuit and wiring connection used in a normal CMOS image sensor. A read circuit having a configuration of three transistors of a reset transistor 5, a read transistor 6, and an amplifying transistor 7 are added to each photodiode 4, and these are controlled by a vertical shift register 8 or a horizontal shift register 9.

Although the three-transistor configuration is shown in FIG. 5, a four-transistor configuration may also be adopted.

In the configuration shown in FIG. 5, each opening 2 shown in FIG. 4 is provided to overlap the three consecutive photodiodes 4. Transistors and wiring lines other than the photodiode 4 shown in FIG. 5 are provided in a region not overlapping the opening 2 and are shielded from light.

In this manner, the light use efficiency is improved by forming a solid-state imaging device using the spectral element 1 instead of a color filter. In addition, sampling points of an optical image detected by the three consecutive transistors 4r, 4g, and 4b included in a unit pixel are the same since the opening 2 is the same. Accordingly, it becomes possible to image a high-quality color image.

In addition, for the spectral element 1, it is understood from experiments that spectral separation does not easily occur when natural light, in which the distribution of light in the oscillation direction is not uniform, is incident on the trapezoidal opening 2 and the spectral separation easily occurs when polarized light is incident on the trapezoidal opening 2.

For example, in a case where polarized light (hereinafter, referred to as x-polarized light) whose oscillation direction is an x direction in FIG. 2 or polarized light whose oscillation direction is a y direction in FIG. 2 is incident on the trapezoidal opening 2 of the spectral element 1, color separation shown in FIG. 2 can be performed. Particularly in the case when the x-polarized light is incident, satisfactory spectral separation is possible. For example, the spectral separation can be made to easily occur by providing a polarizing element on the spectral element 1 and making incident light polarized in the longitudinal direction (height direction of the trapezoid; in the trapezoidal opening 2, the height direction is longitudinal with respect to the length of a bottom side) of the trapezoidal opening 2 so that the light is incident inside the opening 2.

Figure 6:
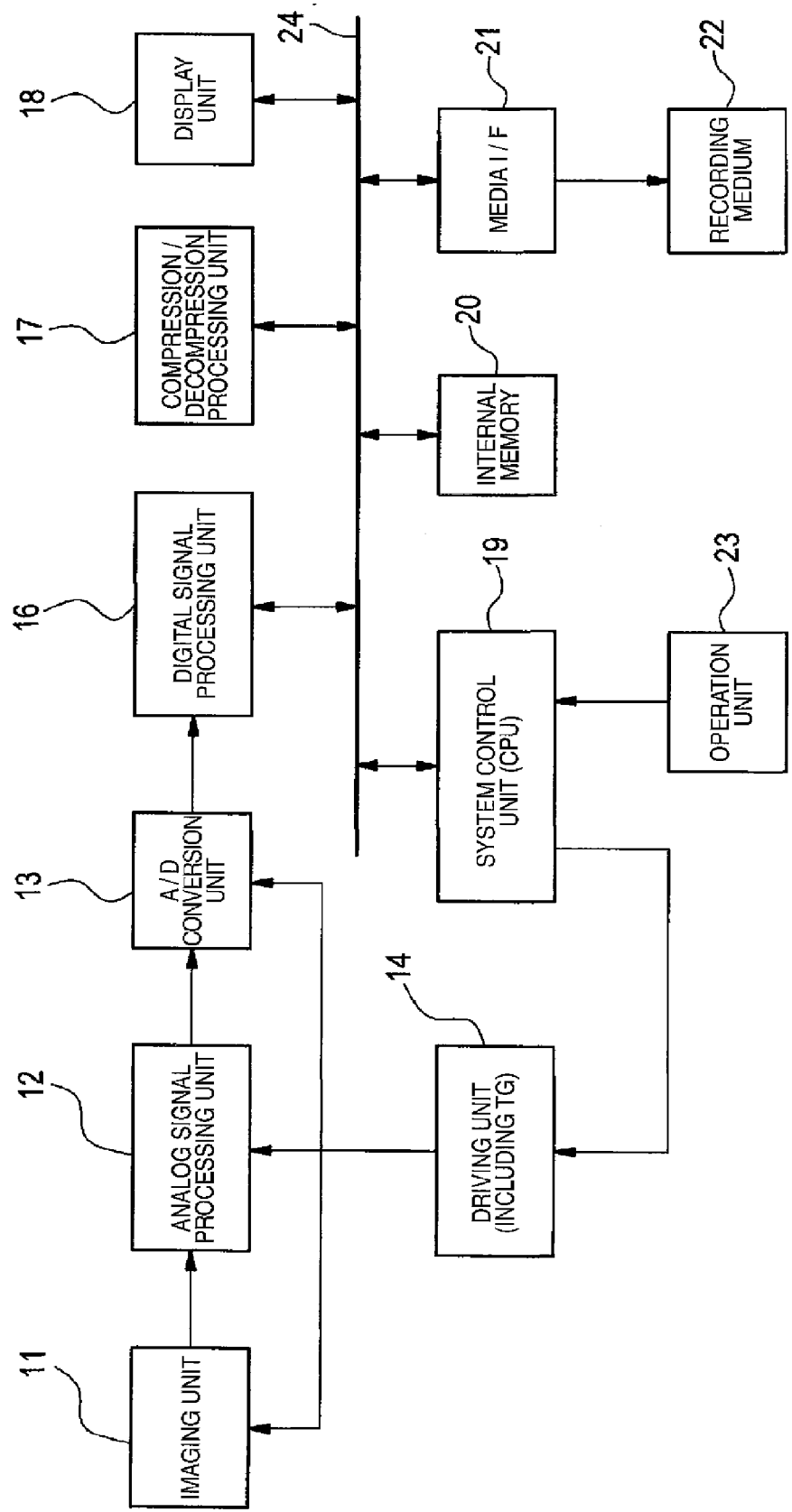
FIG. 6 is a block diagram illustrating the schematic configuration of a digital camera that is an example of an imaging apparatus for describing the first embodiment of the invention.

FIG. 6 is a block diagram illustrating the schematic configuration of a digital camera that is an example of an imaging apparatus for describing an embodiment of the invention.

A digital camera shown in FIG. 1 includes an imaging unit 11, an analog signal processing unit 12, an A/D conversion unit 13, a driving unit 14, a digital signal processing unit 16, a compression/decompression processing unit 17, a display unit 18, a system control unit 19, an internal memory 20, a media interface (I/F) 21, a recording medium 22, and an operation unit 23. The digital signal processing unit 16, the compression/decompression processing unit 17, the display unit 18, the system control unit 19, the internal memory 20, and the media interface 21 are connected to a system bus 24.

The imaging unit 11 serves to image a photographic subject using an optical system including an imaging lens and a solid-state imaging device, and outputs an analog imaging signal. The analog signal processing unit 12 performs predetermined analog signal processing on an imaging signal acquired in the imaging unit 11. The A/D conversion unit 13 converts an analog signal, which is obtained by processing in the analog signal processing unit 12, into a digital signal.

When the digital camera is set to an imaging mode (mode in which it is possible to image a photographic subject and to record photographed image data), the driving unit 14 supplies predetermined pulses to the imaging unit 11, the analog signal processing unit 12, and the A/D conversion unit 13 using driving pulses supplied from the system control unit 19, thereby driving the imaging unit 11, the analog signal processing unit 12, and the A/D conversion unit 13.

Examples of a photographing mode include a still image photographing mode in which still image data can be recorded and a moving image photographing mode in which moving image data can be recorded. Examples of the still image photographing mode include a monochrome photographing mode in which a monochrome image can be photographed and a color photographing mode in which a color image can be photographed.

The digital signal processing unit 16 generates image data by performing digital signal processing, which corresponds to an operation mode set by the operation unit 23, on the digital signal from the A/D conversion unit 13. Examples of processing performed by the digital signal processing unit 16 include black level correction processing (OB processing), linear matrix correction processing, white balance adjustment processing, gamma control processing, synchronization processing, and Y/C conversion processing. The digital signal processing unit 16 is formed by using a DSP, for example.

The compression/decompression processing unit 17 performs compression processing on the image data generated in the digital signal processing unit 6 and decompression processing on the compressed image data obtained from the recording medium 22.

The display unit 18 is configured to include, for example, an LCD display device and serves to display an image based on the image data that has been subjected to digital signal processing after photographing. The display unit 18 also displays an image based on image data obtained by decompressing the compressed image data recorded in the recording medium 22. Moreover, a through image in a photographing mode, information on various states and operations of a digital camera, and the like may also be displayed.

The system control unit 19 includes a processor operating by a predetermined program as a main component and makes an overall control of a digital camera including a photographing operation.

The internal memory 20 is a DRAM, for example. The internal memory 20 is used as a work memory of the digital signal processing unit 16 or system control unit 19 and also used as a buffer memory for temporarily storing photographed image data recorded in the recording medium 22 or a buffer memory for image data to be displayed on the display unit 8. The media interface 21 performs input/output of data to/from the recording medium 22, such as a memory card.

The operation unit 23 serves to operate various kinds of operations while using a digital camera and includes a release button (not shown) for making a photographing instruction.

Figure 7:
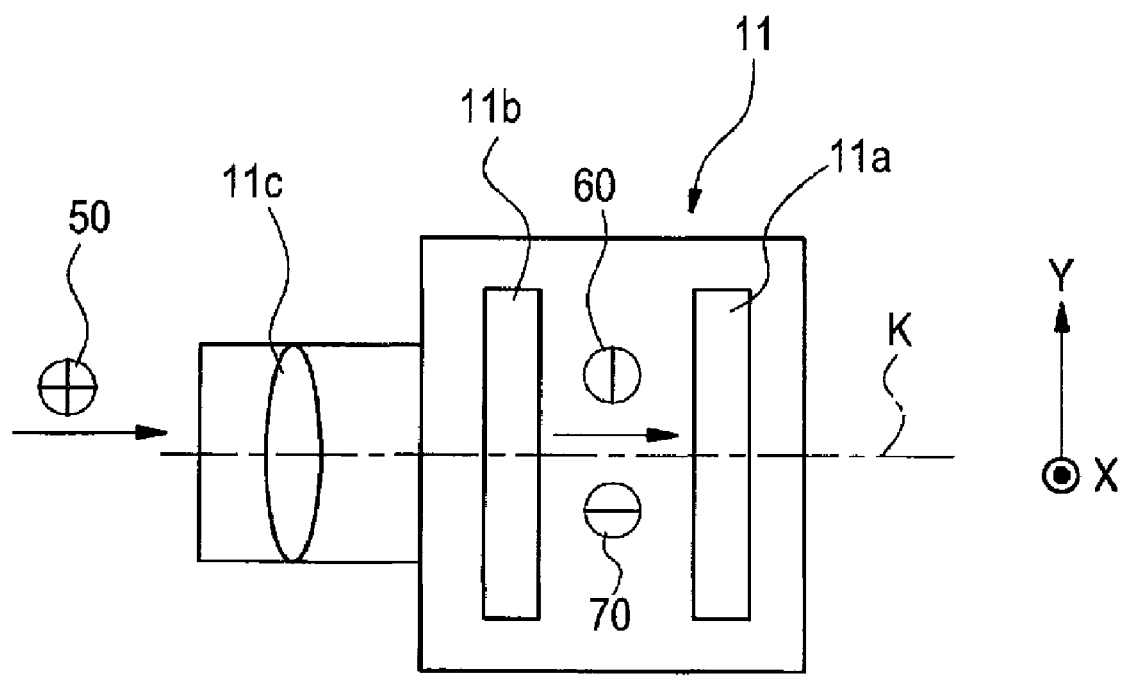
FIG. 7 is a view illustrating the internal configuration of an imaging unit shown in FIG. 6.

FIG. 7 is a view illustrating the internal configuration of the imaging unit 11 shown in FIG. 6.

As shown in FIG. 7, the imaging unit 11 includes an imaging lens 11c, a solid-state imaging device 11a, and a polarizing element 11b which is provided on an optical path K from a photographic subject to the solid-state imaging device 11a and makes polarized light transmitted therethrough.

In the solid-state imaging device 11a, a plurality of unit pixels shown in FIG. 3 are arrayed such that an X direction shown in FIG. 7 and the direction x shown in FIG. 2 match each other and a Y direction shown in FIG. 7 and the y direction shown in FIG. 2 match each other. The solid-state imaging device 11a is configured such that the unit pixels shown in FIG. 3 are arrayed in the shape of a two-dimensional array in the X and Y directions as shown in FIG. 4 and the signal read circuit and the wiring connection shown in FIG. 5 are formed in the semiconductor substrate formed with the photodiodes 4r, 4g, and 4b.

The polarizing element 11b is an element that allows polarized light, such as vertically polarized light 60 (polarized light whose oscillation direction is the Y direction in the drawing) or horizontally polarized light 70 (polarized light whose oscillation direction is the X direction of in the drawing) included in incident light 50, to be transmitted therethrough and is formed by a known polarizer or polarizing plate. In order to perform more satisfactory spectral separation, it is preferable that the polarizing element 11b transmit the horizontally polarized light 70 therethrough.

When photographing is performed, the incident light 50 is transmitted through the imaging lens 11c to be incident on the polarizing element 11b, and only the vertically polarized light 60 or the horizontally polarized light 70 of the incident light 50 is transmitted through the polarizing element 11b. The polarized light having transmitted through the polarizing element 11b is incident on the solid-state imaging device 11a, is separated by the opening 2 of each spectral element 1, and is incident on the photodiodes 4r, 4g, and 4b provided below the opening 2.

An electric charge generated in the photodiodes 4r, 4g, and 4b by the incident light is converted into a signal and is output from the solid-state imaging device 11a. The output signal is input to the digital signal processing unit 16 after analog signal processing and A/D conversion processing. In the digital signal processing unit 16, image data having the same number of image data as the number of unit pixels included in the solid-state device 11a is generated by processing three digital signals obtained from the unit pixel as one image data. The image data generated is compressed and is then recorded in the recording medium 22.

As described above, according to the digital camera of the present embodiment, polarized light can be incident on the solid-state imaging device 11a. Accordingly, since spectral separation can be performed satisfactorily in each spectral element 1 of the solid-state imaging device 11a, the image quality can be improved.

Figure 8:
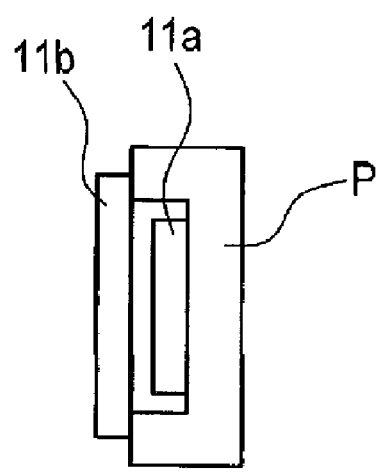
FIG. 8 is a modified example of the imaging unit shown in FIG. 6.

In addition, it is general that the solid-state imaging device 11a is placed in a package electrically connectable to a circuit board of the digital camera, and the inside of the package is sealed by cover glass. Therefore, as shown in FIG. 8, it is preferable to adopt a configuration in which a package P is sealed with the polarizing element 11b instead of the cover glass after placing the solid-state imaging device 11a in the package P. In this manner, it becomes possible to reduce the size and cost of the imaging unit 11.

Second Embodiment

Figure 9:
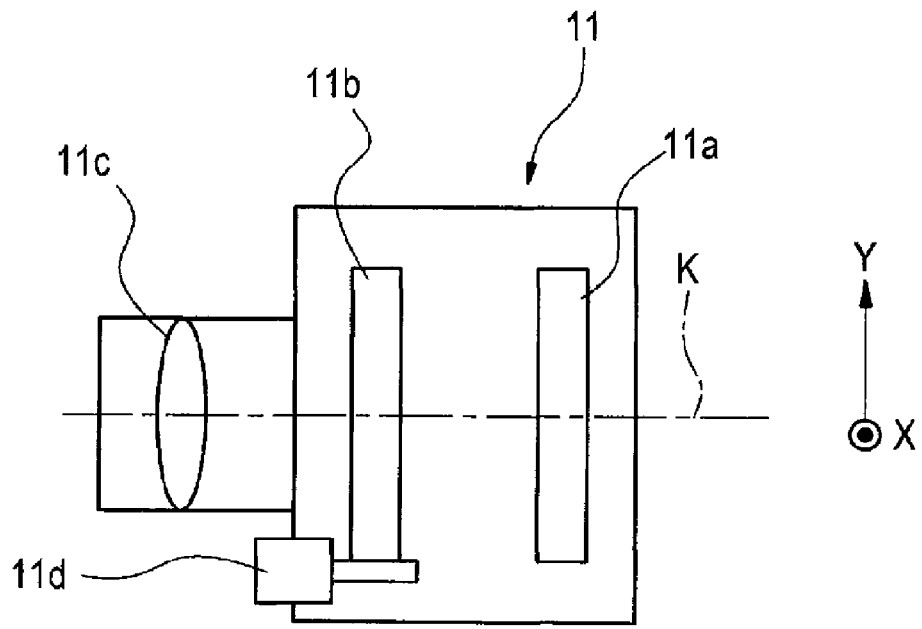
FIG. 9 is a view illustrating the internal configuration of an imaging unit of a digital camera according to a second embodiment of the invention.

FIG. 9 is a view illustrating the internal configuration of an imaging unit of a digital camera according to a second embodiment of the invention. In FIG. 9, the same components as in FIG. 7 are denoted by the same reference numerals.

An imaging unit 11 shown in FIG. 9 has a configuration in which a driving mechanism 11d, which makes a polarizing element 11b being retracted from and being inserted into an optical path K, is added to the imaging unit 11 shown in FIG. 7.

The driving mechanism 11d is controlled by a driving unit 14, and can move the polarizing element 11b in the Y direction.

Next, an operation of the present embodiment will be described.

FIRST OPERATION EXAMPLE

Figure 10:
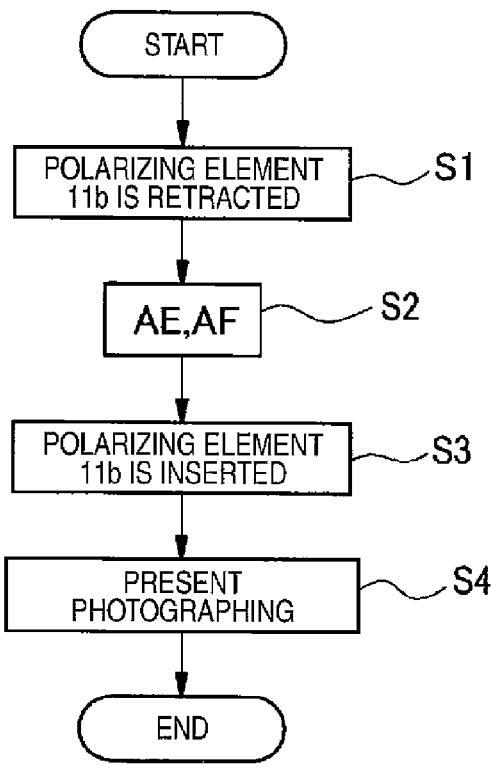
FIG. 10 is a flow chart for describing a first operation example of the digital camera of the second embodiment.

FIG. 10 is a flow chart for describing a first operation example of a digital camera of the second embodiment.

When a user half-presses a release button to make an instruction of photographing preparation, the polarizing element 11b is completely retracted from the optical path K (step S1). Then, preparatory photographing for determining a photographing condition is performed by the imaging unit 11 and the photographing condition, such as an exposure value and a focusing position, is automatically determined from an imaging signal, which has been acquired from the solid-state imaging device 11a by the preparatory photographing, by the system control unit 19 (step S2).

Then, the polarizing element 11b is inserted on the optical path K (step S3). Then, when the release button is pressed fully to make an instruction of the present photographing, the present photographing is performed in the determined photographing condition by the imaging unit 11 (step S4) and color image data generated by the present photographing is recorded, completing the photographing operation.

Thus, according to the digital camera of the present embodiment, in the case of preparatory photographing in which the spectral performance of the spectral element 1 is not needed, the preparatory photographing is performed in a state where the polarizing element 11b is retracted from the optical path K. Therefore, since the amount of light incident on the solid-state imaging device 11a can be increased at the time of preparatory photographing, the accuracy in determining a photographing condition can be improved.

SECOND OPERATION EXAMPLE

Figure 11:
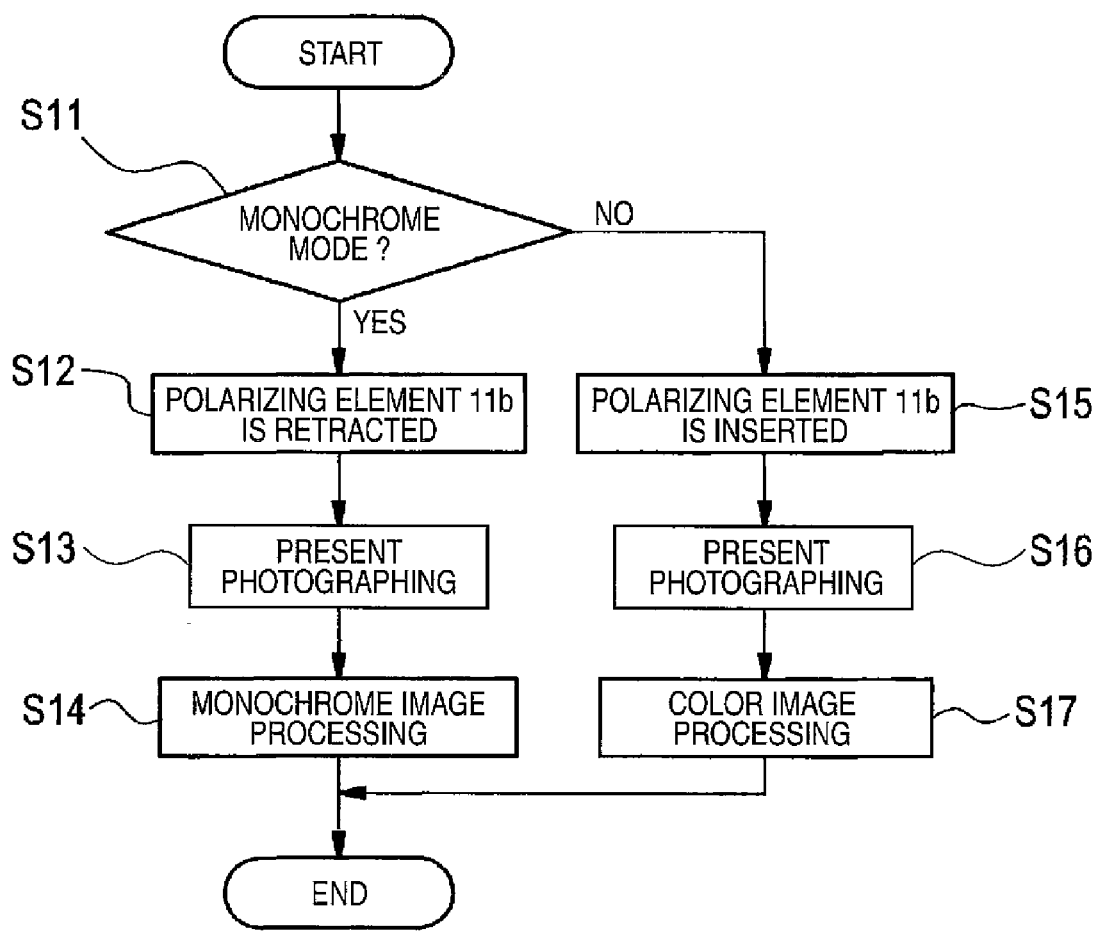
FIG. 11 is a flow chart for describing a second operation example of the digital camera of the second embodiment.

FIG. 11 is a flow chart for describing a second operation example of the digital camera of the second embodiment.

When a monochrome photographing mode is set in step S11, the polarizing element 11b is completely retracted from the optical path K (step S12). In this state, preparatory photographing for determining a photographing condition is performed by the imaging unit 11, such that the photographing condition is determined. When the release button is pressed fully to make an instruction of the present photographing, the present photographing is performed in the determined photographing condition by the imaging unit 11 (step S13). Processing for generating monochrome image data from the imaging signal obtained by the present photographing is performed by the digital signal processing unit 16 (step S14), and the generated monochrome image data is recorded in the recording medium 22. In addition, the monochrome image data may be generated, for example, by adding three imaging signals obtained from a unit pixel to generate one imaging signal and treating the imaging signal as one image data.

On the other hand, when a color photographing mode is set in step S11, the polarizing element 11b is inserted on the optical path K (step S15). In this state, preparatory photographing for determining a photographing condition is performed by the imaging unit 11, such that a photographing condition is determined. Then, when the release button is pressed fully to make an instruction of the present photographing, the present photographing is performed in the determined photographing condition by the imaging unit 11 (step S16). Processing for generating color image data from the imaging signal obtained by the present photographing is performed by the digital signal processing unit 16 (step S17), and the generated color image data is recorded in the recording medium 22, completing the photographing operation.

Thus, according to the digital camera of the present embodiment, in the case of monochrome photographing mode in which the spectral performance of the spectral element 1 is not needed, the present photographing is performed in a state where the polarizing element 11b is retracted from the optical path K. Therefore, the image quality of a monochrome image can be improved while improving the image quality of a color image.

THIRD OPERATION EXAMPLE

Figure 12:
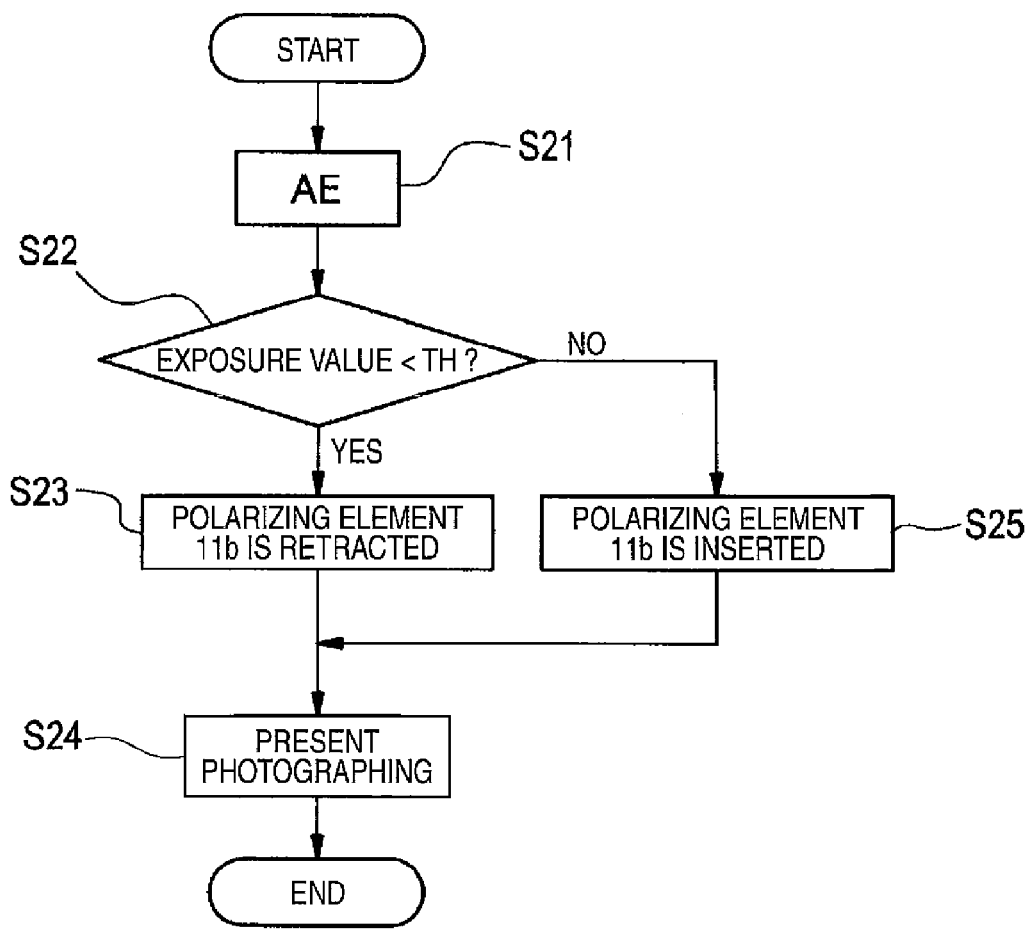
FIG. 12 is a flow chart for describing a third operation example of the digital camera of the second embodiment.

FIG. 12 is a flow chart for describing a third operation example of the digital camera of the second embodiment.

When a user half-presses the release button to make an instruction of photographing preparation, preparatory photographing for determining a photographing condition is performed by the imaging unit 11 and the photographing condition, such as an exposure value and a focusing position, is automatically determined from an imaging signal, which has been acquired from the solid-state imaging device 11a by the preparatory photographing, by the system control unit 19 (step S21).

Then, the system control unit 19 determines the size of the determined exposure value (step S22). When the exposure value is less than a threshold value TH, the polarizing element 11b is made to be retracted from the optical path K (step S23). Then, when the release button is pressed fully to make an instruction of the present photographing, the present photographing is performed in the determined photographing condition by the imaging unit 11 (step S24) and color image data generated by the present photographing is recorded, completing the photographing operation.

On the other hand, when the exposure value is more than the threshold value TH, the polarizing element 11b is inserted on the optical path K (step S25). Then, when the release button is pressed fully to make an instruction of the present photographing, the present photographing is performed in the determined photographing condition by the imaging unit 11 (step S24) and color image data generated by the present photographing is recorded, completing the photographing operation.

Thus, according to the digital camera of the present embodiment, the present photographing is performed in a state where the polarizing element 11b is retracted from the optical path K in the case where the exposure value is less than the threshold value. As a result, deterioration of image quality caused by lack of the amount of light can be prevented. In addition, this driving is effective in the case where deterioration of image quality caused by lack of the amount of light is more serious than deterioration of image quality caused by spectral performance degradation even though the spectral performance of the spectral element 1 is degraded when the polarizing element 11b is retracted from the optical path K.

As described above, since the digital camera according to the present embodiment includes the driving mechanism 11d capable of making the polarizing element 11b being retracted from and being inserted on the optical path K, it becomes possible to adopt various patterns of driving according to a photographing condition.

Figure 13:
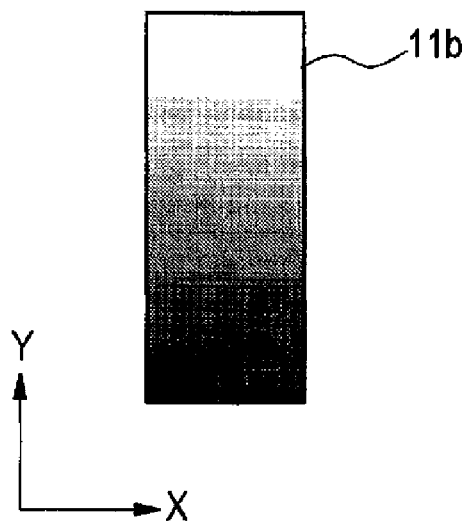
FIG. 13 is a view illustrating a modified example of a polarizing element.

Furthermore, it has been described that the amount of transmitted light of the polarizing element 11b is the same at any position of the polarizing element 11b. However, it is also possible to adopt the polarizing element 11b shown in FIG. 13, which has a gradient of the amount of transmitted light in a direction (Y direction) being retracted and being inserted by the driving mechanism 11d. A more accurate control of the amount of light becomes possible by moving the polarizing element 11b having a Y-direction gradient of the amount of transmitted light in the Y direction.

Third Embodiment

In general, natural light is reflected to become polarized light having distribution of an oscillation direction in a specific direction. That is, there are various kinds of photographic subjects to be photographed, such as a photographic subject in which vertically polarized light is strong and a photographic subject in which horizontally polarized light is strong. In the digital camera of the first or second embodiment, for example, only horizontal polarized light can be incident on the solid-state imaging device 11a. Accordingly, in case of photographing a photographic subject in which vertically polarized light is strong, a natural image may not be acquired.

Therefore, in the present embodiment, photographing corresponding to various photographic subjects can be executed by making the polarizing element 11b rotatable. Hereinafter, the configuration of a digital camera of a third embodiment will be described.

Figure 14:
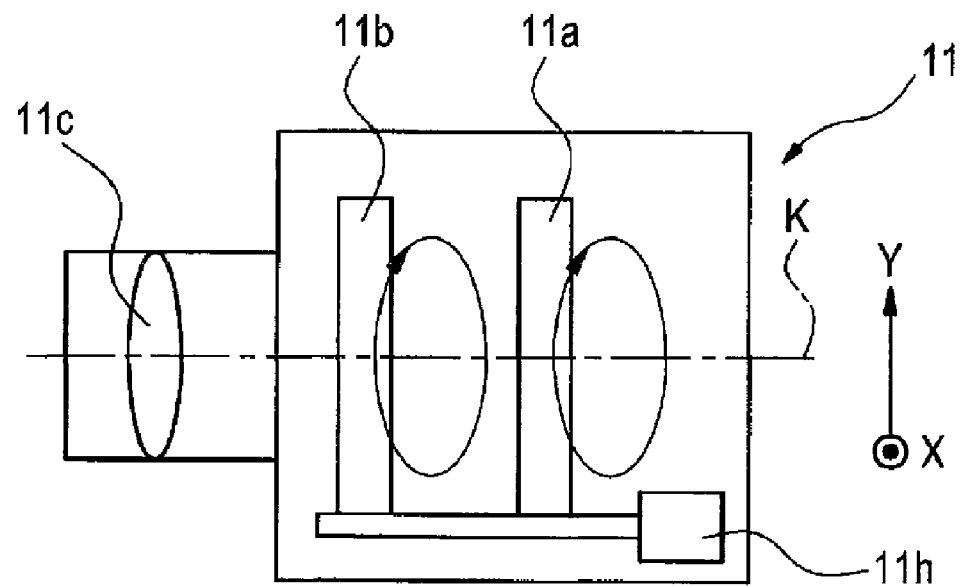
FIG. 14 is a view illustrating the internal configuration of an imaging unit of a digital camera according to a third embodiment of the invention.

FIG. 14 is a view illustrating the internal configuration of an imaging unit of the digital camera according to the third embodiment of the invention In FIG. 14, the same components as in FIG. 7 are denoted by the same reference numerals.

An imaging unit 11 shown in FIG. 14 has a configuration in which a driving mechanism 11h, which makes a polarizing element 11b and a solid-state imaging device 11a rotatable on an XY plane, is added to the imaging unit 11 shown in FIG. 7. The driving mechanism 11h is controlled by the driving unit 14.

The driving mechanism 11h serves to rotate the oscillation direction of polarized light incident on the solid-state imaging device 11a on the XY plane, and is a mechanism capable of rotating the polarizing element 11b on the XY plane in order to rotate the oscillation direction.

In addition, the driving mechanism 11h rotates the solid-state imaging device 11a according to the rotation position of the polarizing element 11b such that the oscillation direction of polarized light incident on the solid-state imaging device 11a matches a longitudinal direction (x direction of FIG. 2) or a direction (y direction of FIG. 2) perpendicular to the longitudinal direction of the opening 2 of the spectral element 1 of the solid-state imaging device 11a.

Here, one driving mechanism 11h is provided. However, a driving mechanism for rotating the polarizing element 11b and a driving mechanism for rotating the solid-state imaging device 11a may be provided separately, and these driving mechanisms may be controlled to rotate the solid-state imaging device 11a according to rotation of the polarizing element 11b.

An operation of the digital camera configured as described above will be described.

When an instruction of photographing preparation is made, the polarizing element 11b is rotated such that the oscillation direction of polarized light transmitted through the polarizing element 11b matches the Y direction and the solid-state imaging device 11a is rotated such that the longitudinal direction or the direction perpendicular to the longitudinal direction of the opening 2 of the spectral element 1 of the solid-state imaging device 11a matches the Y direction. Then, preparatory photographing is performed in this state. Then, when a release button is pressed fully, the present photographing is performed and first image data obtained by the present photographing is recorded.

Then, the polarizing element 11b is rotated such that the oscillation direction of polarized light transmitted through the polarizing element 11b matches the X direction and the solid-state imaging device 11a is rotated such that the longitudinal direction or the direction perpendicular to the longitudinal direction of the opening 2 of the spectral element 1 of the solid-state imaging device 11a matches the X direction. When rotation of the solid-state imaging device 11a ends, the present photographing is performed. Then, second image data obtained by the present photographing is recorded.

As described above, according to the digital camera of the present embodiment, photographing corresponding to various photographic subjects becomes possible since it is possible to rotate the polarizing element 11b. In addition, since the solid-state imaging device 11a is also rotated according to the rotation of the polarizing element 11b, all photographic subjects can be photographed with the same spectral performance. Therefore, for example, even in a case of performing processing for obtaining more natural image data by mixing first image data with second image data, it becomes possible to generate comfortable image data.

In addition, although the solid-state imaging device 11a is rotated in the present embodiment, it is also possible to make only the polarizing element 11b rotate. Moreover, in the case of rotating the solid-state imaging device 11a, it is preferable to set the shape of the solid-state imaging device 11a as a rotationally symmetric shape (for example, square).

Furthermore, in the present embodiment, the present photographing is performed twice with one photographing instruction and the first image data and the second image data are recorded. However, a mode in which only the first image data is recorded and a mode in which only the second image data is recorded may be set so that the modes can be selected.

Preferably, the photographing operation is completed by performing the preparatory photographing and the present photographing in a state where the polarizing element 11b is made to rotate such that the oscillation direction of polarized light transmitted through the polarizing element 11b matches the Y direction when the mode in which only the first image data is recorded is set, and the photographing operation is completed by performing the preparatory photographing and the present photographing in a state where the polarizing element 11b is made to rotate such that the oscillation direction of the polarized light transmitted through the polarizing element 11b matches the X direction when the mode in which only the second image data is recorded is set.

Fourth Embodiment

While the digital camera of the third embodiment rotates the polarizing element 11b in order to rotate the oscillation direction of polarized light incident on the solid-state imaging device 11a, a digital camera according to the present embodiment rotates the oscillation direction of polarized light transmitted through the polarizing element 11b and incident on the solid-state imaging device 11a by providing a liquid crystal device between the polarizing element 11b and the solid-state imaging device 11a and controlling a voltage applied to this liquid crystal device to control the alignment of liquid crystal.

Figure 15:
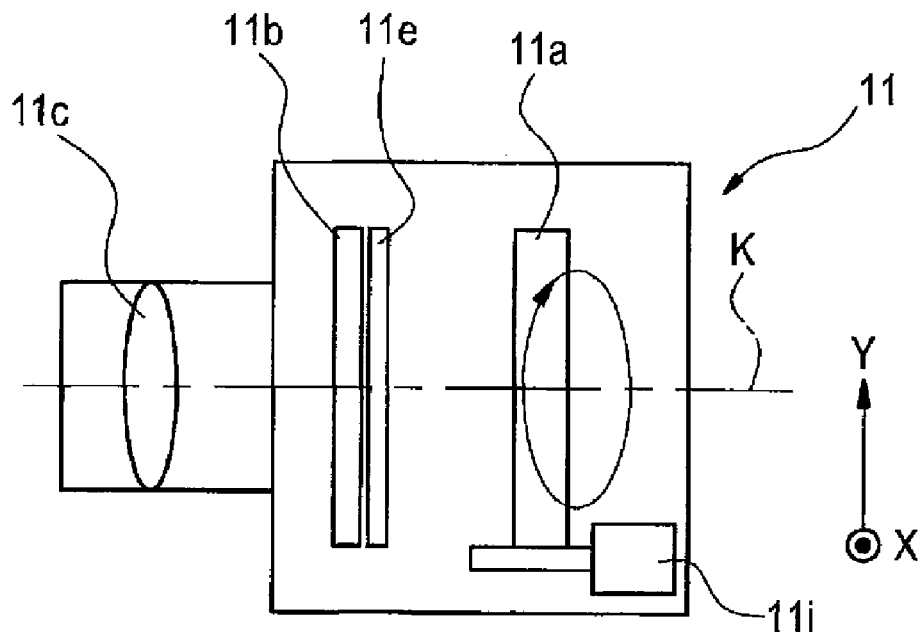
FIG. 15 is a view illustrating the internal configuration of an imaging unit of a digital camera according to a fourth embodiment of the invention.
Figure 16:
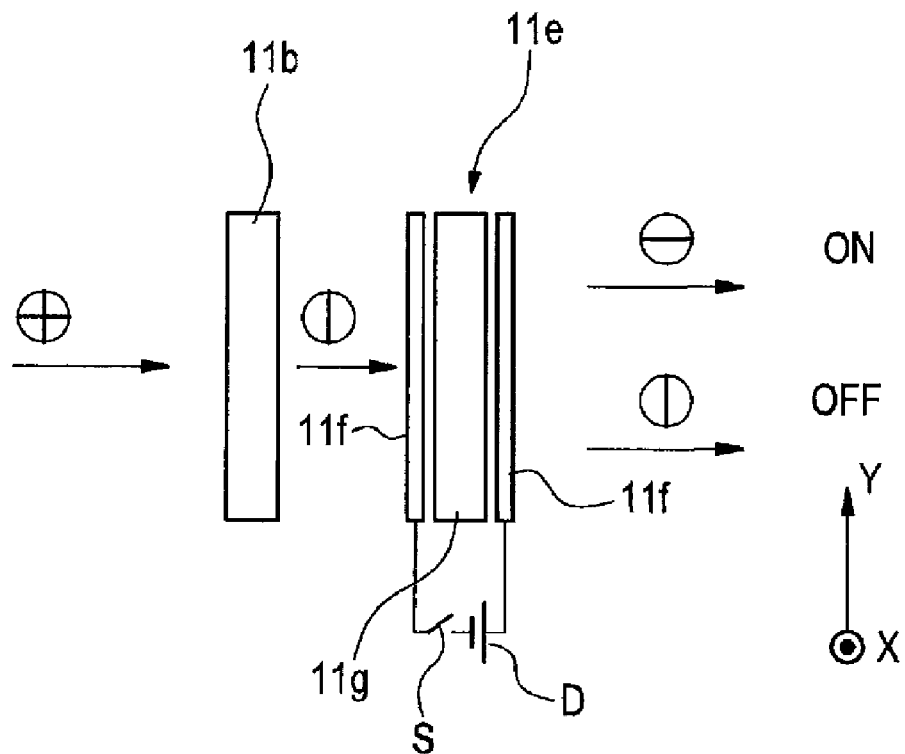
FIG. 16 is a partially enlarged view illustrating the imaging unit shown in FIG. 15.

FIG. 15 is a view illustrating the internal configuration of an imaging unit of the digital camera according to the fourth embodiment of the invention In FIG. 15, the same components as in FIG. 7 are denoted by the same reference numerals. FIG. 16 is a partially enlarged view illustrating the imaging unit 11 shown in FIG. 15.

The imaging unit 11 shown in FIG. 15 has a configuration in which a driving mechanism 11i, which makes a solid-state imaging device 11a rotatable on the XY plane, is added to the imaging unit 11 shown in FIG. 7 and a liquid crystal device 11e is provided between the polarizing element 11b and the solid-state imaging device 11a. The driving mechanism 11i is controlled by the driving unit 14.

The liquid crystal device 11e includes a liquid crystal layer 11g, a pair of electrodes 11f that interposes the liquid crystal layer 11g therebetween, and a switch S that switches between connection of a power supply D to the pair of electrodes 11f and disconnection of the power supply D from the pair of electrodes 11f. When the switch S is turned ON, polarized light transmitted through the polarizing element 11b is emitted after the oscillation direction of the polarized light is rotated by 90° in the liquid crystal layer 11g. When the switch S is turned OFF, polarized light transmitted through the polarizing element 11b is emitted without the oscillation direction of the polarized light being rotated in the liquid crystal layer 11g. Thus, the oscillation direction of the polarized light incident on the solid-state imaging device 11a can be rotated by controlling a voltage applied to the liquid crystal layer 11g. In addition, although the oscillation direction of the polarized light is controlled in the two directions only by ON/OFF of the switch in the present embodiment, the oscillation direction of the polarized light may also be controlled accurately by controlling the voltage applied to the electrodes 11f.

The driving mechanism 11i rotates the solid-state imaging device 11a according to the oscillation direction rotated by the liquid crystal device 11e such that the oscillation direction of polarized light transmitted through the liquid crystal device 11e matches the longitudinal direction (x direction of FIG. 2) or the direction (y direction of FIG. 2) perpendicular to the longitudinal direction of the opening 2 of the spectral element 1 of the solid-state imaging device 11a.

As described above, according to the digital camera of the present embodiment, the oscillation direction of the polarized light transmitted through the polarizing element 11b is incident on the solid-state imaging device 11a while being rotated by the liquid crystal device 11g. Therefore, miniaturization of the digital camera and cost reduction can be realized compared with the case where the polarizing element 11b is rotated by the driving mechanism.

Fifth Embodiment

Figure 17:
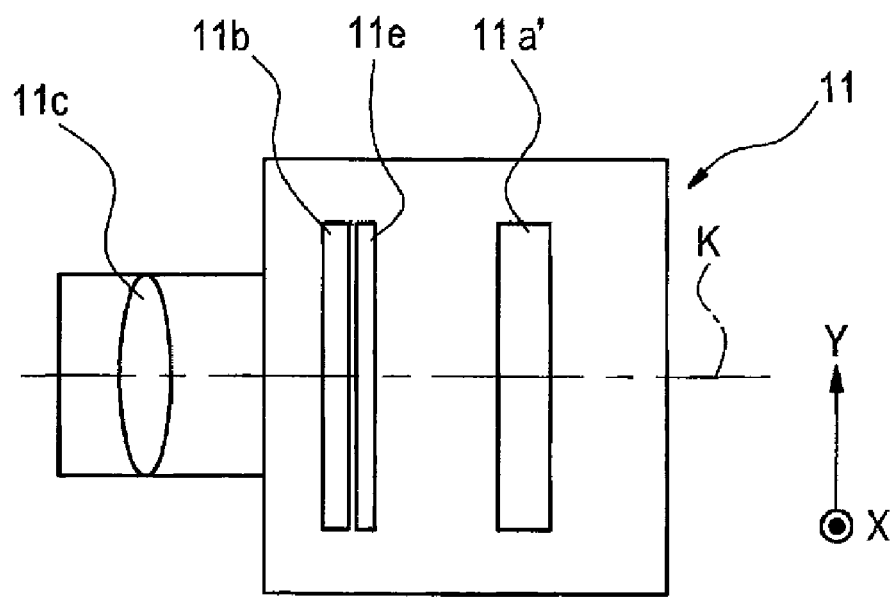
FIG. 17 is a view illustrating the internal configuration of an imaging unit of a digital camera according to a fifth embodiment of the invention.
Figure 18:
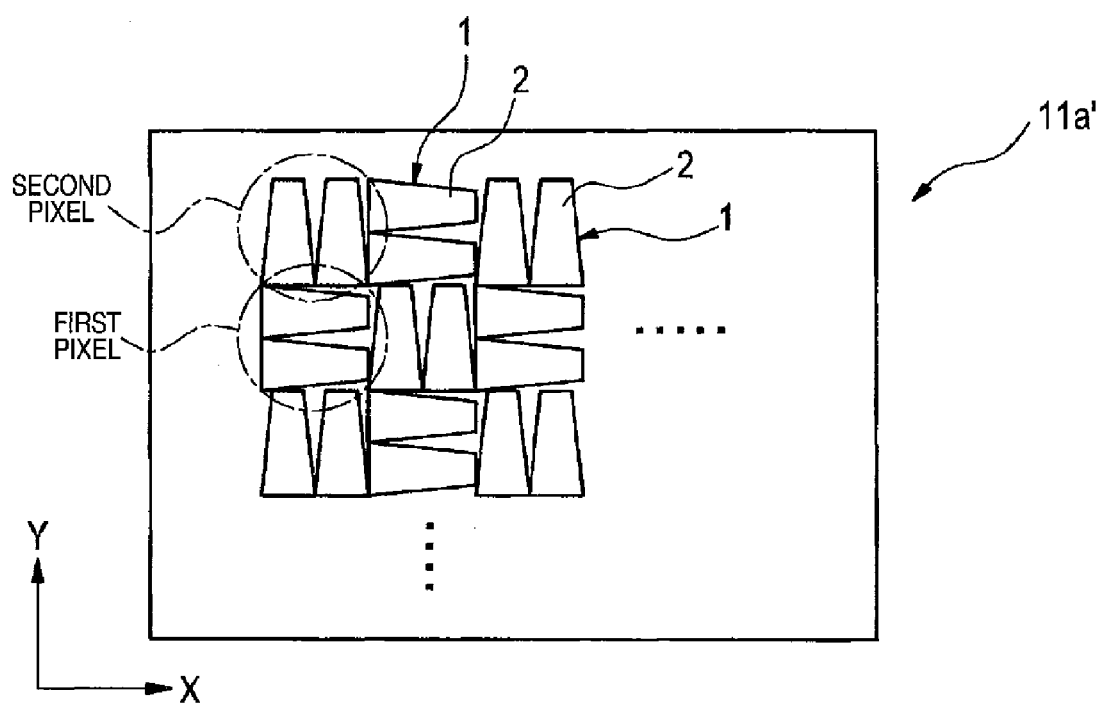
FIG. 18 is a plan view schematically illustrating a solid-state imaging device included in the imaging unit shown in FIG. 17.

FIG. 17 is a view illustrating the internal configuration of an imaging unit of a digital camera according to a fifth embodiment of the invention. In FIG. 17, the same components as in FIG. 15 are denoted by the same reference numerals. FIG. 18 is a plan view schematically illustrating a solid-state imaging device 11a' included in the imaging unit 11 shown in FIG. 17.

As shown in FIG. 18, in the solid-state imaging device 11a' included in the imaging unit 11 of the digital camera according to the fifth embodiment, pixels each including the two unit pixels shown in FIG. 3 are arrayed in the square lattice shape in the X and Y directions. A first pixel obtained by disposing two unit pixels, in which the longitudinal direction of the opening 2 matches the X direction, in the Y direction and a second pixel obtained by disposing two unit pixels, in which the longitudinal direction of the opening 2 matches the Y direction, in the X direction are included in the solid-state imaging device 11a'. The solid-state imaging device 11a' has a configuration in which the first and second pixels are arrayed in a checkered pattern.

An operation of the digital camera configured as described above will be described.

FIRST OPERATION EXAMPLE

When an instruction of photographing preparation is made, the liquid crystal device 11e is controlled such that the oscillation direction of polarized light matches the X direction (or Y direction). Then, preparatory photographing is performed in this state. Then, when the release button is pressed fully, present photographing is performed. A first imaging signal obtained from the first pixel of the solid-state imaging device 11a' by the present photographing is recorded in the internal memory 20.

Then, the present photographing is performed after the liquid crystal device 11e is controlled such that the oscillation direction of the polarized light matches the Y direction (or X direction). A second imaging signal obtained from the second pixel of the solid-state imaging device 11a' by the present photographing is recorded in the internal memory 20.

Then, the digital signal processing unit 16 generates image data using the first imaging signal and the second imaging signal recorded in the internal memory 20. The image data generated is compressed and is then recorded in the recording medium 22. Since the first imaging signal is a signal from the first pixel and the second imaging signal is a signal from the second pixel, imaging signals obtained from all pixels of the solid-state imaging device 11a' can be reproduced by mixing the first and second imaging signals. As a result, image data having the same resolution as the pixel number of the solid-state imaging device 11a can be generated.

In addition, although one image data is generated herein using the first and second imaging signals, it is also possible to generate one image data from the first imaging signal and to generate one image data from the second imaging signal.

As described above, according to the digital camera of the present embodiment, it becomes possible to photograph a photographic subject, in which vertically polarized light is strong, by half of pixels and to photograph a photographic subject, in which horizontally polarized light is strong, by the remaining half of pixels even without moving the solid-state imaging device 11a'. Furthermore, since one image data can also be generated by using the imaging signal obtained from the first pixel and the imaging signal obtained from the second pixel, a photographic subject can be photographed more naturally. Furthermore, each of photographing performed by the first pixel and photographing performed by the second pixel is performed in a state where the oscillation direction of polarized light matches the longitudinal direction or the direction perpendicular to the longitudinal direction of the opening 2 of the spectral element 1. Accordingly, spectral characteristics of the spectral element 1 in performing the photographing twice are the same. As a result, it becomes possible to generate a comfortable image.

SECOND OPERATION EXAMPLE

In the first operation example, the accuracy in determining a photographing condition may be lowered because the photographing condition is determined on the basis of horizontally polarized light or vertically polarized light For example, in the case where a photographing condition is determined on the basis of horizontally polarized light transmitted through the polarizing element 11b, there is a possibility that a photographic subject to be photographed will have polarized light which is vertically strong actually. In order to prevent such determination accuracy from lowering, it is considered to determine a photographing condition using an imaging signal, which is obtained in preparatory photographing using vertical polarized light, and an imaging signal obtained in preparatory photographing using horizontal polarized light. However, in determining a photographing condition where high-speed processing is requested, it is not preferable to perform the preparatory photographing twice.

Therefore, in the second operation example, the liquid crystal device 11e is controlled such that the oscillation direction of polarized light incident on the solid-state imaging device 11a' becomes a direction of 45° from the X direction toward the Y direction at the time of preparatory photographing. Hereinafter, an operation will be described.

Figure 19:
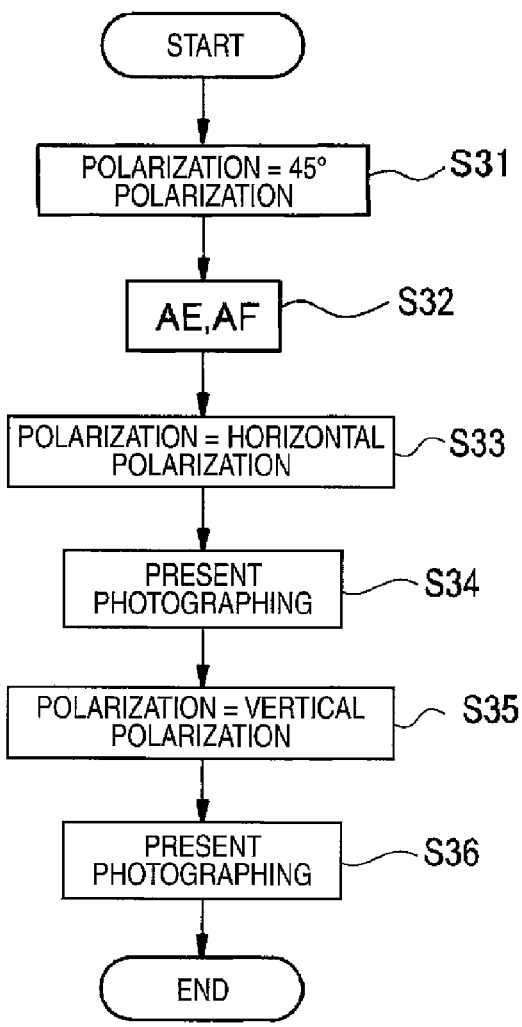
FIG. 19 is a flow chart for describing a second operation example of the digital camera according to the fifth embodiment.

FIG. 19 is a flow chart for describing a second operation example of the digital camera according to the fifth embodiment.

When an instruction of photographing preparation is made, the liquid crystal device 11e is controlled such that the oscillation direction of polarized light becomes a direction of 45° with respect to each of the X and Y directions (step S31). Then, preparatory photographing is performed in this state, and a photographing condition is determined (step S32). When the photographing condition is determined, the liquid crystal device 11e is controlled such that the oscillation direction of polarized light matches the X direction (or Y direction) (step S33). Then, when the release button is pressed fully, present photographing is performed (step S34). A first imaging signal obtained from the first pixel of the solid-state imaging device 11a' by the present photographing is recorded in the internal memory 20.

Then, the liquid crystal device 11e is controlled so that the oscillation direction of the polarized light matches the Y direction (or the X direction) (step S35), and then the present photographing is performed (step S36). A second imaging signal obtained from the second pixel of the solid-state imaging device 11a' by the present photographing is recorded in the internal memory 20.

Then, the digital signal processing unit 16 generates image data using the first and second imaging signals recorded in the internal memory 20. The image data generated is compressed and is then recorded in the recording medium 22.

Thus, according to the second operation example, it is possible to prevent the accuracy in determining a photographing condition from extremely lowering since a photographing condition is determined on the basis of middle polarization of the horizontal polarization and the vertical polarization.

In addition, also in the present embodiment, polarization may be controlled by directly rotating the polarizing element 11b instead of controlling the liquid crystal device 11e.

Figure 20:
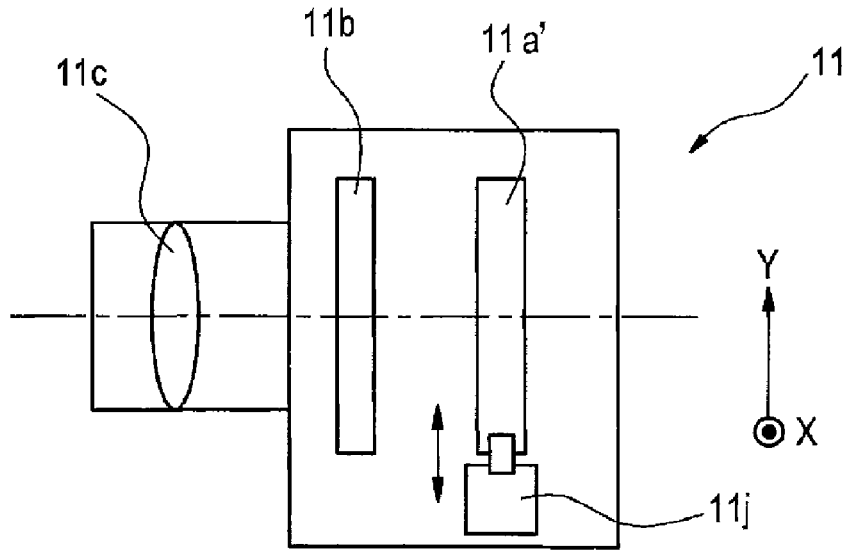
FIG. 20 is a view illustrating the internal configuration of an imaging unit of a digital camera according to a sixth embodiment of the invention.

Moreover, although the pixel of the solid-state imaging device 11a' is configured to include two unit pixels in the present embodiment, it is sufficient that at least one unit pixel is included in the pixel Sixth Embodiment FIG. 20 is a view illustrating the internal configuration of an imaging unit of a digital camera according to a sixth embodiment of the invention In FIG. 20, the same components as in FIG. 17 are denoted by the same reference numerals.

An imaging unit 11 shown in FIG. 20 is configured such that the liquid crystal device 11e of the imaging unit 11 shown in FIG. 17 is removed and a driving mechanism 11j, which makes the solid-state imaging device 11a' movable by an arrangement pitch of first and second pixels in the X direction of X, is added. The driving mechanism 11j is controlled by the driving unit 14. In addition, it is assumed that polarized light transmitted through the polarizing element 11b and incident on the solid-state imaging device 11a' is horizontally polarized light.

An operation of the digital camera configured as described above will be described.

When an instruction of photographing preparation is made, preparatory photographing is performed. Then, when the release button is pressed fully, present photographing is performed. A first imaging signal obtained from the first pixel of the solid-state imaging device 11a' by the present photographing is recorded in the internal memory 20.

Then, the solid-state imaging device 11a' moves by one pixel pitch in the X direction by control of the driving unit 14. When the movement is completed, the present photographing is performed, and a second imaging signal obtained from the second pixel of the solid-state imaging device 11a' by the present photographing is recorded in the internal memory 20.

Then, the digital signal processing unit 16 generates image data using the first imaging signal recorded in the internal memory 20 and generates image data from the second imaging signal. The image data generated is compressed and is then recorded in the recording medium 22.

As described above, according to the digital camera of the present embodiment, the same photographic subject can be photographed with different spectral characteristics.

Seventh Embodiment

Figure 21:
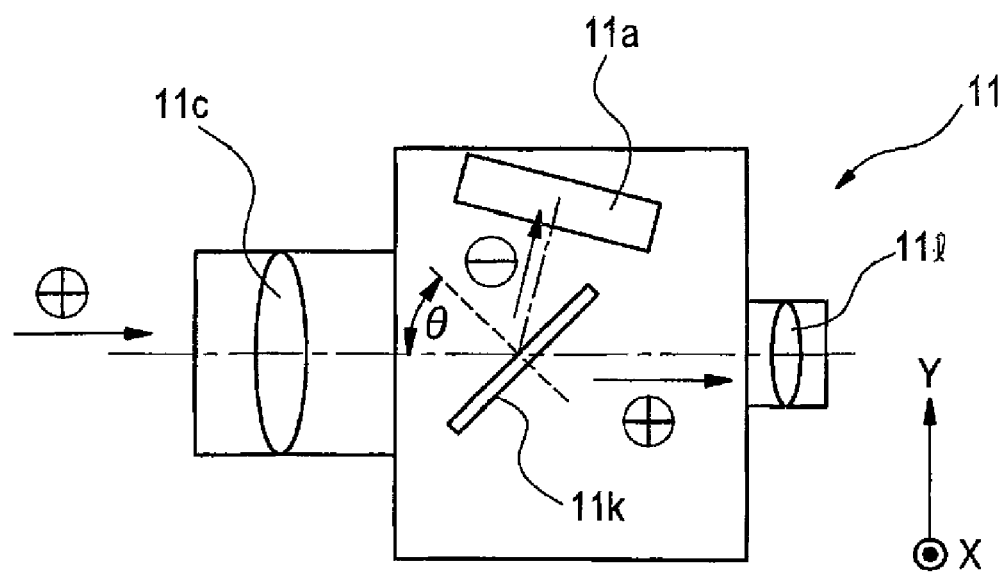
FIG. 21 is a view illustrating the internal configuration of an imaging unit of a digital camera according to a seventh embodiment of the invention.

FIG. 21 is a view illustrating the internal configuration of an imaging unit of a digital camera according to a seventh embodiment of the invention. In FIG. 21, the same components as in FIG. 7 are denoted by the same reference numerals.

In the imaging unit 11 shown in FIG. 21 a half mirror 11k is used as the polarizing element 11b. By making the half mirror 11k reflect incident light by a predetermined angle (Brewster's angle), polarized light can be generated from the reflected light. The solid-state imaging device 11a is disposed on a path of the reflected light reflected by the half mirror 11k, and incident light transmitted through the half mirror 11k is incident on a finder 11l.

By adopting such a configuration, it is possible to make polarized light incident on the solid-state imaging device 11a with a simple configuration. In addition, although the half mirror 11k is used herein, any member capable of reflecting light, such as a mirror, may also be used. The case of a half mirror is preferable because all of the incident light can be effectively used.

Eighth Embodiment

Figure 22:
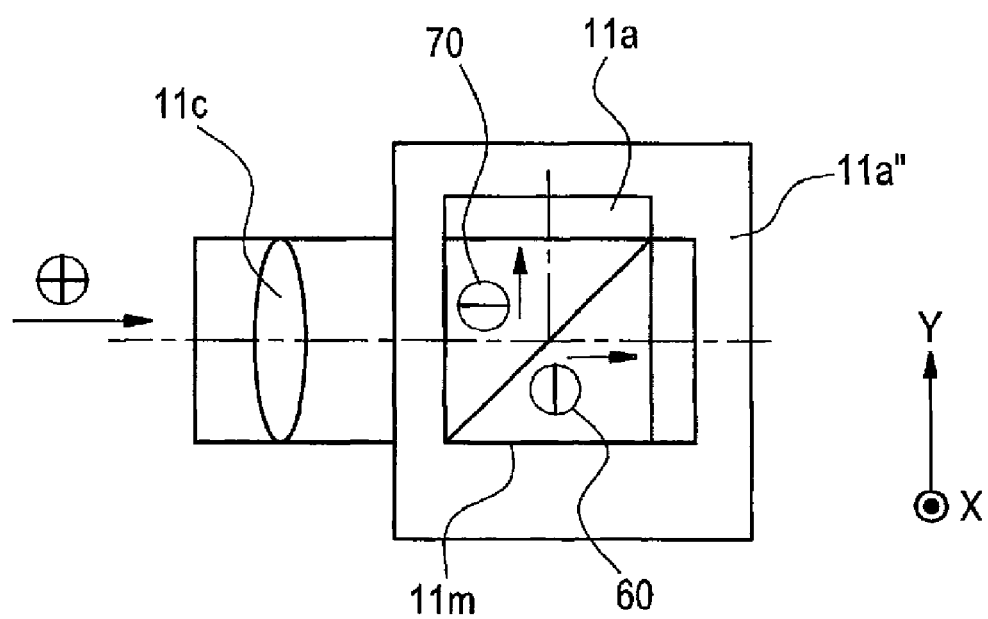
FIG. 22 is a view illustrating the internal configuration of an imaging unit of a digital camera according to an eighth embodiment of the invention.

FIG. 22 is a view illustrating the internal configuration of an imaging unit of a digital camera according to an eighth embodiment of the invention. In FIG. 22, the same components as in FIG. 7 are denoted by the same reference numerals.

An imaging unit 11 shown in FIG. 22 has a configuration in which a polarization beam splitter 11m is used as the polarizing element 11b and a solid-state imaging device 11a and a solid-state imaging device 11a" are disposed on optical paths of two polarized light components separated by the polarization beam splitter 11m, respectively.

The polarization beam splitter 11m serves to separate incident light into two polarized light components. For example, the polarization beam splitter 11m separates incident light into vertically polarized light 60 and horizontally polarized light 70 and emits the vertically polarized light 60 and the horizontally polarized light 70. The solid-state imaging device 11a" is disposed on the optical path of the vertically polarized light 60, and the solid-state imaging device 11a is disposed on the optical path of the horizontally polarized light 70.

Figure 23:
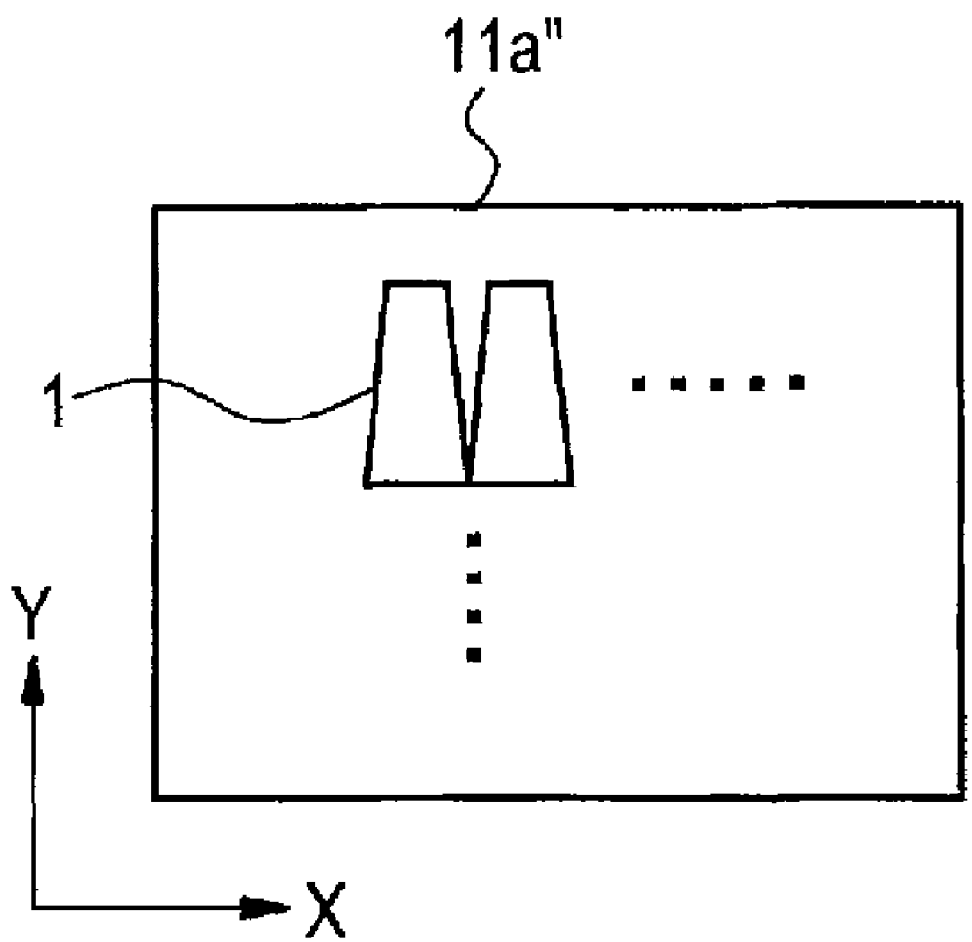
FIG. 23 is a plan view schematically illustrating a solid-state imaging device 11a" included in the imaging unit shown in FIG. 22.

In the solid-state imaging device 11a", unit pixels are arrayed in the shape of a two-dimensional array in the X and Y directions such that an X direction shown in FIG. 22 and the y direction shown in FIG. 2 match each other and a Y direction shown in FIG. 22 and the x direction shown in FIG. 2 match each other (see FIG. 23).

Furthermore, although not shown in the drawing, in the digital camera according to the present embodiment, the analog signal processing unit 12 and the A/D conversion unit 13 shown in FIG. 6 are provided corresponding to each of the solid-state imaging device 11a and the solid-state imaging device 11a" and an imaging signal after A/D conversion in each A/D conversion unit is recorded in the internal memory 20. In addition, the digital signal processing unit 16 generates image data from an imaging signal obtained by photographing using the solid-state imaging device 11a and generates image data from an imaging signal obtained by photographing using the solid-state imaging device 11a", and image data obtained by mixing the two image data is recorded in the recording medium 22.

It is needless to say that each of the two image data may also be recorded in the recording medium 22 separately without mixing the two image data. In addition, a mixing ratio of two image data may be selected by the operation unit 23 such that the two image data is mixed on the basis of the selected mixing ratio. In this case, by displaying a mixing ratio and a mixed image, which is obtained at the time of mixing with the mixing ratio, on the display unit 18, an optimal mixing ratio can be selected while viewing a mixed image displayed. This improves the convenience.

As described above, according to the digital camera of the present embodiment, a photographic subject with vertically polarized light and a photographic subject with horizontally polarized light can be photographed with separate solid-state imaging devices. In addition, since one image data can be generated by mixing image data obtained by the separate solid-state imaging devices, it becomes possible to obtain a more natural image. In addition, since the two solid-state imaging devices have the same spectral characteristics, comfortable image data can be obtained even in the case where image data is mixed.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. An imaging apparatus comprising:
   a solid-state imaging device comprising: a semiconductor substrate; a plurality of photoelectric conversion elements provided in the semiconductor substrate; and a spectral element which is provided over the plurality of photoelectric conversion elements that are consecutive in a straight-line manner, in which a trapezoidal opening longitudinal in a direction from a bottom side into which light incident on the plurality of photoelectric conversion elements is introduced to a top side is provided, and which makes a spectral separation occur in the longitudinal direction by interference between the incident light and light reflected from an inner side surface of the trapezoidal opening; and
   a polarizing element which is provided on an optical path from a photographic subject to the solid-state imaging device and which allows polarized light to be transmitted therethrough.

2. The imaging apparatus according to claim 1, wherein the polarizing element acts as cover glass that seals the solid-state imaging device.

3. The imaging apparatus according to claim 1, further comprising a driving mechanism which makes the polarizing element being retracted from and being inserted on the optical path.

4. The imaging apparatus according to claim 3, further comprising a control unit that makes a control such that the polarizing element is retracted from the optical path at the time of preparatory photographing performed before present photographing so as to determine a photographing condition and the polarizing element is inserted on the optical path at the time of the present photographing.

5. The imaging apparatus according to claim 3, further comprising a control unit that makes a control such that the polarizing element is retracted from the optical path in a monochrome photographing mode and the polarizing element is inserted on the optical path in a color photographing mode.

6. The imaging apparatus according to claim 3, further comprising a control unit that makes a control such that the polarizing element is retracted from the optical path when an exposure value for present photographing is less than a threshold value and the polarizing element is inserted on the optical path when the exposure value is more than the threshold value.

7. The imaging apparatus according to claim 3, wherein the polarizing element has a gradient of the amount of transmitted light in a direction of the retracting and the inserting by the driving mechanism.

8. The imaging apparatus according to claim 1, further comprising an oscillation direction rotating unit that rotates an oscillation direction of the polarized light incident on the solid-state imaging device.

9. The imaging apparatus according to claim 8, further comprising a solid-state imaging device rotating unit that rotates the solid-state imaging device according to the oscillation direction rotated by the oscillation direction rotating unit.

10. The imaging apparatus according to claim 9, wherein the solid-state imaging device rotating unit rotates the solid-state imaging device such that the longitudinal direction or a direction perpendicular to the longitudinal direction matches the rotated oscillation direction.

11. The imaging apparatus according to claim 8, wherein the spectral element in which the longitudinal direction is a first direction is a first spectral element, and the spectral element in which the longitudinal direction is a second direction perpendicular to the first direction is a second spectral element,
the solid-state imaging device has a first pixel comprising at least one of the first spectral element and a second pixel comprising at least one of the second spectral element, and
the imaging apparatus further comprises: a photographing control unit that performs first photographing in a state where the oscillation direction of the polarized light is made to match the first direction of the first spectral element or a direction perpendicular to the first direction and performs second photographing in a state where the oscillation direction of the polarized light is made to match the second direction of the second spectral element or a direction perpendicular to the second direction; and an image generating unit that generates image data using an imaging signal acquired from the first pixel by the first photographing and an imaging signal acquired from the second pixel by the second photographing.

12. The imaging apparatus according to claim 11, wherein the photographing control unit performs preparatory photographing for determining photographing conditions of the first photographing and the second photographing before performing the first photographing and the second photographing, and
the oscillation direction rotating unit rotates the polarization direction such that the oscillation direction of the polarized light becomes a direction of 45° with respect to each of the first direction and the second direction at the time of the preparatory photographing.

13. The imaging apparatus according to claim 8, wherein the oscillation direction rotating unit is a liquid crystal device provided between the polarizing element and the solid-state imaging device.

14. The imaging apparatus according to claim 1,
wherein the spectral element in which the longitudinal direction is a first direction is a first spectral element, and the spectral element in which the longitudinal direction is a second direction perpendicular to the first direction is a second spectral element,
the solid-state imaging device has a first pixel comprising at least one of the first spectral element and a second pixel comprising at least one of the second spectral element,
the first and second pixels are arrayed in a checkered pattern, and
the imaging apparatus comprises a driving mechanism capable of moving the solid-state imaging device.

15. The imaging apparatus according to claim 1, wherein the polarizing element is a reflecting member which reflects incident light and makes the reflected light incident on the solid-state imaging device.

16. The imaging apparatus according to claim 15, wherein the reflecting member is a half mirror, and the imaging apparatus comprises a finder on which light transmitted through the half mirror is incident.

17. The imaging apparatus according to claim 1, wherein two of the solid-state imaging devices are included, the polarizing element is a polarization beam splitter, and one of the two solid-state imaging devices is disposed on an optical path of first polarized light separated by the polarization beam splitter, and the other one of the two solid-state imaging devices is disposed on an optical path of second polarized light separated by the polarization beam splitter.

18. The imaging apparatus according to claim 17,
wherein the longitudinal direction of the spectral element of the one solid-state imaging device matches the oscillation direction of the first polarized light, and the longitudinal direction of the spectral element of the other solid-state imaging device matches the oscillation direction of the second polarized light.

19. The imaging apparatus according to claim 18, further comprising an image data mixing unit that mixes first image data, which is obtained by photographing in the one solid-state imaging device, and second image data, which is obtained by photographing in the other solid-state imaging device, with a designated mixing ratio.

20. An imaging method of imaging a photographic subject by a solid-state imaging device, comprising:
performing imaging by making polarized light of light from the photographic subject incident on a solid-state imaging device comprising a semiconductor substrate, a plurality of photoelectric conversion elements provided in the semiconductor substrate and a spectral element which is provided over the plurality of photoelectric conversion elements that are consecutive in a straight-line manner, in which a trapezoidal opening longitudinal in a direction from a bottom side into which light incident on the plurality of photoelectric conversion elements is introduced to a top side is provided, and which makes a spectral separation occur in the longitudinal direction by interference between the incident light and light reflected from an inner side surface of the trapezoidal opening.

21. The imaging method according to claim 20, wherein light from the photographic subject is made incident on the solid-state imaging device at the time of preparatory photographing performed before present photographing so as to determine a photographing condition and the polarized light is made incident on the solid-state imaging device at the time of the present photographing.

22. The imaging method according to claim 20, wherein light from the photographic subject is made incident on the solid-state imaging device in a monochrome photographing mode and the polarized light is made incident on the solid-state imaging device in a color photographing mode.

23. The imaging method according to claim 20, wherein light from the photographic subject is made incident on the solid-state imaging device when an exposure value for present photographing is less than a threshold value, and the polarized light is made incident on the solid-state imaging device when the exposure value is more than the threshold value.

24. The imaging method according to claim 20, wherein the imaging is performed by rotating the oscillation direction of the polarized light incident on the solid-state imaging device.

25. The imaging method according to claim 24, wherein the solid-state imaging device is rotated according to the oscillation direction of the polarized light rotated.

26. The imaging method according to claim 25, wherein the solid-state imaging device is rotated such that the longitudinal direction or a direction perpendicular to the longitudinal direction matches the rotated oscillation direction.

27. The imaging method according to claim 24,
wherein the spectral element in which the longitudinal direction is a first direction is a first spectral element, and the spectral element in which the longitudinal direction is a second direction perpendicular to the first direction is a second spectral element,
the solid-state imaging device has a first pixel comprising at least one of the first spectral element and a second pixel comprising at least one of the second spectral element,
first photographing is performed in a state where the oscillation direction of the polarized light is made to match the first direction of the first spectral element or a direction perpendicular to the first direction,
second photographing is performed in a state where the oscillation direction of the polarized light is made to match the second direction of the second spectral element or a direction perpendicular to the second direction, and
image data is generated and recorded using an imaging signal acquired from the first pixel by the first photographing and an imaging signal acquired from the second pixel by the second photographing.

28. The imaging method according to claim 27, wherein preparatory photographing for determining photographing conditions of the first photographing and the second photographing is performed before performing the first photographing and the second photographing, and
the polarization direction is rotated such that the oscillation direction of the polarized light becomes a direction of 45° with respect to each of the first direction and the second direction at the time of the preparatory photographing.

29. The imaging method according to claim 24, wherein the polarized light is incident on the solid-state imaging device through a liquid crystal device, and the oscillation direction is rotated by controlling the alignment of the liquid crystal device.

30. The imaging method according to claim 20,
wherein the spectral element in which the longitudinal direction is a first direction is a first spectral element, and the spectral element in which the longitudinal direction is a second direction perpendicular to the first direction is a second spectral element,
the solid-state imaging device has a first pixel comprising at least one of the first spectral element and a second pixel comprising at least one of the second spectral element,
the first and second pixels are arrayed in a checkered pattern, and
photographing is performed twice in a case where the solid-state imaging device is moved and a case where the solid-state imaging device is not moved.

31. The imaging method according to claim 20, wherein the polarized light incident on the solid-state imaging device is generated by reflecting incident light with a reflecting member.

32. The imaging method according to claim 31, wherein the reflecting member is a half mirror, and light transmitted through the half mirror is incident on a finder.

33. The imaging method according to claim 20,
wherein two of the solid-state imaging devices are used as a first solid-state imaging device and a second solid-state imaging device, and
the imaging is performed by separating incident light into first polarized light and second polarized light and making the first polarized light incident on the first solid-state imaging device and the second polarized light incident on the second solid-state imaging device.

34. The imaging method according to claim 33, wherein the longitudinal direction of the spectral element of the first solid-state imaging device matches the oscillation direction of the first polarized light, and the longitudinal direction of the spectral element of the second solid-state imaging device matches the oscillation direction of the second polarized light.

35. The imaging method according to claim 34, wherein the first image data obtained by photographing in the first solid-state imaging device and second image data obtained by photographing in the second solid-state imaging device are mixed with a designated mixing ratio.

* * * * *